(12) United States Patent
Mrunal Abhijith et al.

(10) Patent No.: US 11,637,062 B2
(45) Date of Patent: Apr. 25, 2023

(54) INTERCONNECT STRUCTURE AND METHOD FOR MANUFACTURING THE INTERCONNECT STRUCTURE

(71) Applicant: TAIWAN SEMICONDUCTOR MANUFACTURING COMPANY LTD., Hsinchu (TW)

(72) Inventors: Khaderbad Mrunal Abhijith, Hsinchu (TW); Yu-Yun Peng, Hsinchu (TW); Fu-Ting Yen, Hsinchu (TW); Chen-Han Wang, Hsinchu County (TW); Tsu-Hsiu Perng, Hsinchu County (TW); Keng-Chu Lin, Ping-Tung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/676,719

(22) Filed: Feb. 21, 2022

(65) Prior Publication Data

US 2022/0189871 A1 Jun. 16, 2022

Related U.S. Application Data

(62) Division of application No. 16/884,925, filed on May 27, 2020, now Pat. No. 11,257,753.

(60) Provisional application No. 62/963,918, filed on Jan. 21, 2020.

(51) Int. Cl.
*H01L 23/522* (2006.01)
*H01L 23/532* (2006.01)
*H01L 21/768* (2006.01)

(52) U.S. Cl.
CPC .... *H01L 23/5226* (2013.01); *H01L 21/76802* (2013.01); *H01L 21/76819* (2013.01); *H01L 21/76826* (2013.01); *H01L 21/76877* (2013.01); *H01L 23/53295* (2013.01)

(58) Field of Classification Search
CPC ........... H01L 23/5226; H01L 21/76802; H01L 21/76819; H01L 21/76826; H01L 21/76877; H01L 23/53295; H01L 21/76805; H01L 21/76807; H01L 21/76814; H01L 21/76831; H01L 21/76895; H01L 23/485; H01L 21/28518; H01L 21/76843; H01L 21/76855; H01L 23/53242
See application file for complete search history.

*Primary Examiner* — Bac H Au
(74) *Attorney, Agent, or Firm* — WPAT Law; Anthony King

(57) ABSTRACT

The present disclosure provides an interconnect structure and a method for forming an interconnect structure. The method for forming an interconnect structure includes forming a first interlayer dielectric (ILD) layer over a substrate, forming a contact in the first ILD layer, forming a second ILD layer over the first ILD layer, forming a first opening in the second ILD layer and obtaining an exposed side surface of the second ILD layer over the contact, forming a densified dielectric layer at the exposed side surface of the second ILD layer, including oxidizing the exposed side surface of the second ILD layer by irradiating a microwave on the second ILD layer, and forming a via in contact with the densified dielectric layer.

20 Claims, 37 Drawing Sheets

INTERCONNECT STRUCTURE AND METHOD FOR MANUFACTURING THE INTERCONNECT STRUCTURE

CROSS REFERENCE TO RELATED APPLICATIONS

This application claims the benefit of prior-filed application Ser. No. 16/884,925, filed May 27, 2020, and prior-filed provisional application No. 62/963,918, filed Jan. 21, 2020, which are incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased contact resistance, which presents performance, yield, and cost challenges. It has been observed that higher contact resistances exhibited by interconnects in advanced IC technology nodes can significantly delay (and, in some situations, prevent) signals from being routed efficiently to and from IC devices, such as transistors, negating any improvements in performance of such IC devices in the advanced technology nodes. Accordingly, although existing interconnects have been generally adequate for their intended purposes, they have not been entirely satisfactory in all respects.

On the other hand, although barrier-free interconnect structures may exhibit a lower overall resistance, however, it would be at the expense of reliability wherein leakage would become a dominant issue. Furthermore, during the fabrication of a barrier-free interconnect structure, it is more difficult to control the end point of a planarization operation (such as chemical mechanical planarization, CMP) for removing excessive metal and residues. In addition, it is observed that the metal residue may penetrate an interface between conductive material and dielectric layer if the planarization operation is not well-controlled. Such issue may lead to damages and thereby causing degraded performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
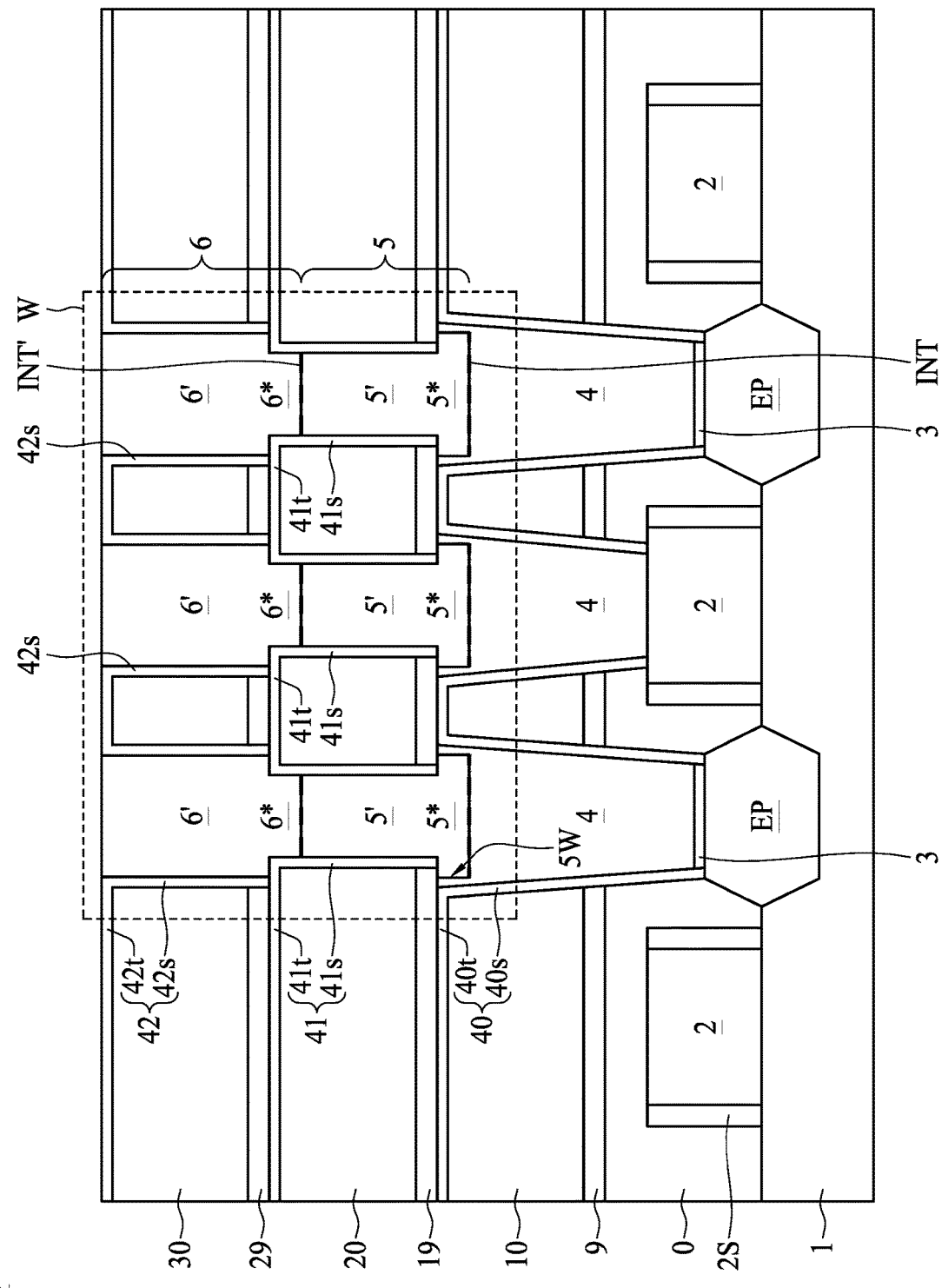
FIG. 1A is a cross sectional view of an interconnect structure, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure provides an interconnect structure and method for fabricating an interconnect structure. Specifically, the present disclosure provides an interconnect structure with barrier that can be formed by a method compatible for back-end-of-line (BEOL) fabrication, wherein the barrier may alleviate leakage issue while avoiding significantly increasing overall resistance.

The present disclosure further provides a method for decreasing overall resistance that can be compatible to the method for forming the barrier and back-end-of-line (BEOL) fabrication. Under some circumstances, temperatures of the operations performed during the BEOL phase are limited (for example, lower than 400° C.) to prevent affection on dopant regions. Furthermore, the present disclosure further provides an interconnect structure and method for fabricating an interconnect structure to alleviate the issues related to planarization operation, as will be discussed subsequently.

In the present disclosure, BEOL generally encompasses processes related to fabricating a multilayer interconnect (MLI) feature that interconnects IC features fabricated by front-end-of-line (FEOL) and middle-end-of-line (MEOL), thereby enabling operation of the IC devices.

Figure 1B:
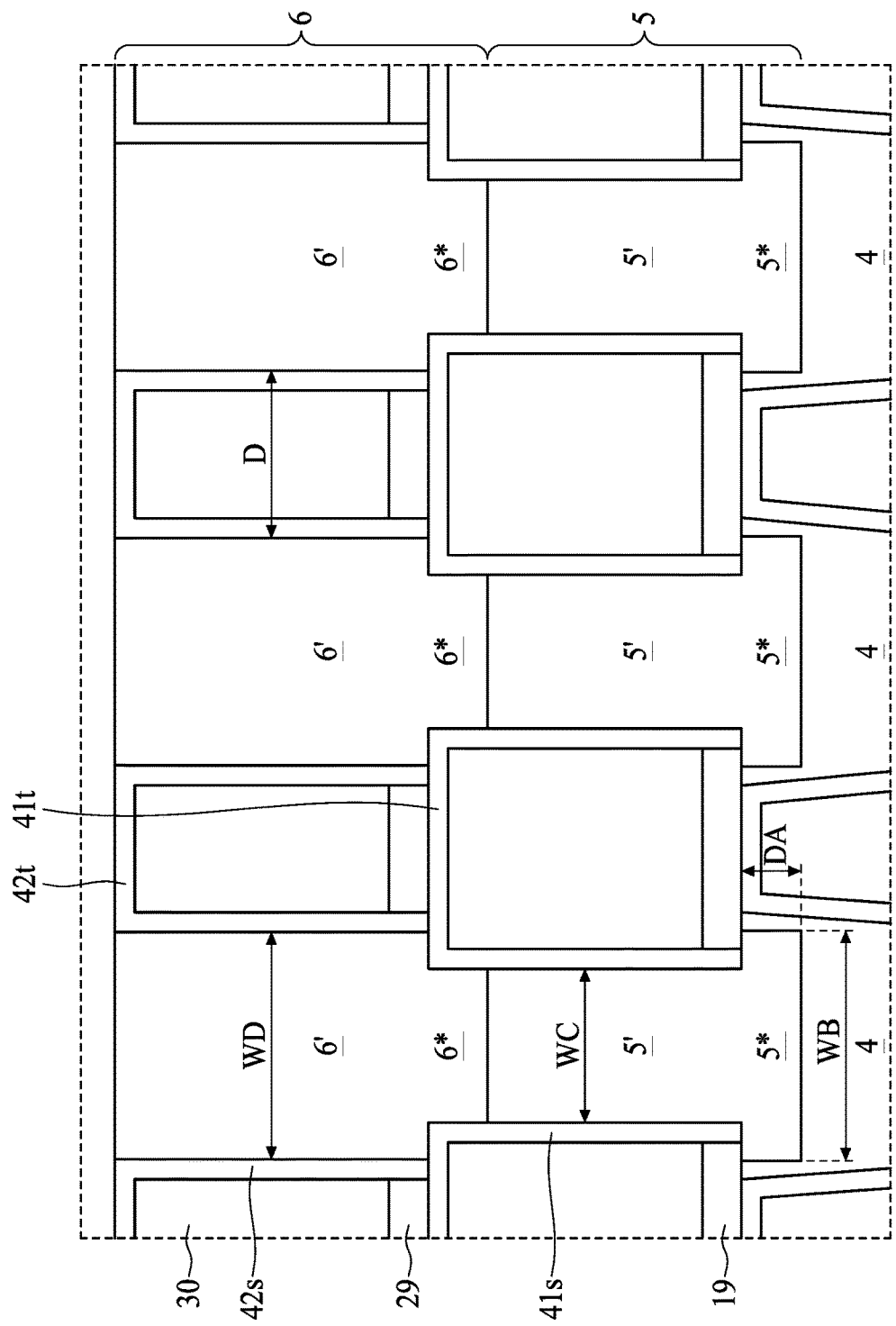
FIG. 1B is a partially enlarged fragmentary diagrammatic views of a portion W of the interconnect structure of FIG. 1A, according to some embodiments of the present disclosure.

Referring to FIG. 1A and FIG. 1B, FIG. 1A is a cross sectional view of an interconnect structure, FIG. 1B is a partially enlarged fragmentary diagrammatic views of a portion W of the interconnect structure of FIG. 1A, according to some embodiments of the present disclosure. An interconnect structure 100 includes a substrate 1. In some embodiments, the substrate 1 includes silicon, Alternatively or additionally, the substrate 1 includes another material, such as germanium, silicon carbide, gallium arsenide, gallium phosphide, indium phosphide, indium arsenide, and/or indium antimonide, or, an alloy semiconductor, such as silicon germanium (SiGe), GaAsP, AlInAs, AlGaAs, GaInAs, GaInP, and/or GaInAsP; or combinations thereof. In some other embodiments, substrate 1 includes one or more group III-V materials, one or more group II-IV materials, or combinations thereof. In some other embodiments, substrate 1 is a semiconductor-on-insulator substrate, such as a silicon-on-insulator (SOI) substrate, a silicon germanium-on-insulator (SGOI) substrate, or a germanium-on-insulator (GOI) substrate. Substrate 1 can include various doped regions configured according to design requirements, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, substrate 1 includes doped regions formed with a combination of p-type dopants and n-type dopants.

In some embodiment, conductive regions EP are formed at a top surface of the substrate 1. The conductive regions EP may include epitaxial features, such as source regions and drain regions, and may optionally be doped by dopant, such as n-type dopant or p-type dopant. In some embodiments, a silicide layer 3 may be disposed above each of the conductive regions EP.

A plurality of gate structures 2 can be formed over the substrate 1. Each of the gate structures may have a sidewall spacer 2S disposed on its sidewall. The gate structures 2 are adjacent to conductive regions EP. A passivation layer 0 is disposed over the substrate 1 and surrounding the gate structures 2. In some embodiments, the gate structures 2 can be metal gate stacks that are configured to achieve desired functionalities. In some embodiments, a top surface of the passivation layer 0 is over a top surface of a gate structure 2. In some other alternative embodiments, a top surface of the passivation layer 0 is coplanar with a top surface of a gate structure 2.

The interconnect structure 100 further includes a first etch stop layer 9 over the passivation layer 0, a first interlayer dielectric layer 10 over the first etch stop layer 9, a second etch stop layer 19 over the first interlayer dielectric layer 10, and a second interlayer dielectric layer 20 over the second etch stop layer 19. The interconnect structure 100 may further include a third etch stop layer 29 over the second interlayer dielectric layer 20 and a third interlayer dielectric layer 30 over the third etch stop layer 29. The first interlayer dielectric layer 10, the second interlayer dielectric layer 20, and the third interlayer dielectric layer 30 may include a dielectric material, such as silicon oxide ($SiO_x$), silicon oxycarbide (SiOC), porous-doped low-k silicon dioxide, Fluorine doped silicon oxide, carbon doped silicon dioxide, air gap dielectric, spin-on dielectric, or the combination thereof. In some embodiments, the first etch stop layer 9, the second etch stop layer 19 and the third etch stop layer 29 may include materials that can be utilized as a planarization etch stop layer, such as nitride, silicide, silicon nitride, or silicon oxynitride.

The interconnect structure 100 further includes a conductive device-level contact 4 (which can be referred to as metal-to-device (MD) contact) disposed over the conductive regions EP and the gate structure 2. In some embodiments, a bottom surface of each of the device-level contact 4 over the conductive regions EP is in contact with a top surface of the silicide layer 3. A top surface of the device-level contact 4 is coplanar with a top surface of the first interlayer dielectric layer 10. A top portion of the device-level contact 4 has a concaved profile. In some embodiments, the device-level contact 4 may include tungsten (W). In some other alternative embodiments, the device-level contact 4 may include cobalt, or other types of conductive materials. In some alternative embodiments, a top surface of the gate structure 2 is recessed, wherein a portion of the device-level contact may be laterally surrounded by the gate structure 2.

The interconnect structure 100 further includes a zeroth densified dielectric layer 40, wherein the zeroth densified dielectric layer 40 includes a sidewall portion 40s surrounding the device-level contact 4 and a top portion 41t between a top surface of the first interlayer dielectric layer 10 and a bottom surface of the second etch stop layer 19. In some embodiment, a density of the zeroth densified dielectric layer 40 is greater than a density of the first interlayer dielectric layer 10. The zeroth densified dielectric layer 40 may be formed by oxidizing a surface of the first interlayer dielectric layer 10. In some embodiments, the zeroth densified dielectric layer 40 and the first interlayer dielectric layer 10 may have a similar material, but the percentage of oxygen composition in the zeroth densified dielectric layer 40 is greater than the same in the first interlayer dielectric layer 10. In some embodiments, the zeroth densified dielectric layer 40 may have a greater structural density than that of the first interlayer dielectric layer 10, therefore spacing the zeroth densified dielectric layer 40 between the device-level contact 4 and the first interlayer dielectric layer 10 can alleviate current leakage between adjacent device-level contacts 4 when the line space is reduced to be lower than the range of from 5 nm to 20 nm. A thickness of the zeroth densified dielectric layer 40 is in a range from about 0.2 nm to about 2 nm. When a thickness of the zeroth densified dielectric layer 40 is less than 0.2 nm, the zeroth densified dielectric layer 40 may not effectively alleviate current leakage; when a thickness of the zeroth densified dielectric layer 40 is greater than 2 nm, it may increase the overall k-value of the first interlayer dielectric layer 10. In some embodiments, the presence of the zeroth densified dielectric layer 40 may be detected by microscope, Energy-dispersive X-ray spectroscopy (EDX) mapping or any other composition analysis. For example, an interface between the zeroth densified dielectric layer 40 and the first interlayer dielectric layer 10 may be observed. In some alternative embodiments, the first interlayer dielectric layer 10 includes silicon oxide ($SiO_x$), and the zeroth densified dielectric layer 40 includes silicon oxynitrides ($SiO_xN_y$).

The interconnect structure 100 further includes conductive vias 5 respectively disposed above each of the device-level contact 4. The conductive via 5 has a bottom portion 5* in the concaved portion of the device-level contact 4. That is, a contact interface INT between a bottom surface of the conductive via 5 and the device-level contact 4 is at a level below the top surface of the first interlayer dielectric layer 10. A top surface of each of the conductive vias 5 is lower than a top surface of the second interlayer dielectric layer 20.

The interconnect structure 100 further includes a first densified dielectric layer 41, wherein the first densified dielectric layer 41 includes a sidewall portion 41s surrounding an upper portion 5' of the conductive vias 5 and a top portion 41t between a top surface of the second interlayer dielectric layer 20 and a bottom surface of the third etch stop layer 29. In some embodiments, the first densified dielectric layer 41 spaces a sidewall of the second interlayer dielectric layer 20 and a sidewall of the second etch stop layer 19 from a sidewall of the conductive via 5. In some embodiments, the bottom portion 5* of the conductive via 5 is free from being surrounded by the first densified dielectric layer 41. In some alternative embodiments, the first densified dielectric layer 41 further includes a portion (not shown in FIG. 1A) surrounding the bottom portion 5* of the conductive via 5. In some embodiment, a density of the first densified dielectric layer 41 is greater than a density of the second interlayer dielectric layer 20. The first densified dielectric layer 41 may be formed by oxidizing a surface of the second interlayer dielectric layer 20. In some embodiments, the first densified dielectric layer 41 and the second interlayer dielectric layer 20 may have a similar material, but the percentage of oxygen composition in the first densified dielectric layer 41 is greater than the same in the second interlayer dielectric layer 20. In some embodiments, the first densified dielectric layer 41 may have a greater structural density than that of the second interlayer dielectric layer 20, therefore spacing the first densified dielectric layer 41 between the conductive via 5 and the second interlayer dielectric layer 20 can alleviate current leakage between adjacent conductive via 5 when the line space is reduced to be lower than the range of from 5 nm to 20 nm. A thickness of the first densified dielectric layer 41 is in a range from about 0.2 nm to about 2 nm. When a thickness of the first densified dielectric layer 41 is less than 0.2 nm, the first densified dielectric layer 41 may not effectively alleviate current leakage; when a thickness of the first densified dielectric layer 41 is greater than 2 nm, it may increase the overall k-value of the second interlayer dielectric layer 20. In some embodiments, the presence of the first densified dielectric layer 41 may be detected by microscope, Energy-dispersive X-ray spectroscopy (EDX) mapping or any other composition analysis. For example, an interface between the first densified dielectric layer 41 and the second interlayer dielectric layer 20 may be observed.

In some alternative embodiments, the second interlayer dielectric layer 20 includes silicon oxide ($SiO_x$), and the first densified dielectric layer 41 includes silicon oxynitrides ($SiO_xN_y$).

Accordingly, a material of the conductive via 5 may have a conductivity greater than the device-level contact 4, such as ruthenium (Ru), in order to have a relatively lower resistivity for the entire interconnect structure 100. Specifically, ruthenium has a lower mean free path (mfp) and lower bulk resistance comparing to some other conductive materials, such as cobalt. In some embodiments, a depth DA of the bottom portion 5* of the conductive via 5 is in a range from about 1 nm to about 5 nm. A width of the bottom portion 5* of the conductive via 5 is greater than a width of the upper portion 5' of the conductive via 5. In some embodiments, a width WB of the bottom portion 5* of the conductive via 5 is in a range from about 10 nm to about 20 nm, and a width WC of the upper portion 5' of the conductive via 5 is in a range from about 10 nm to about 15 nm. In some embodiments, a sidewall 5w of the bottom portion 5* of the conductive via 5 is in direct contact with an inner sidewall of the concaved portion of the device-level contact 4. By having such configuration, the contact area between the conductive via 5 and the device-level contact 4 can be increased (comparing to only contacting at the position leveling with the top surface of the first interlayer dielectric layer 10), thereby further lowering the interface resistance between the conductive via 5 and the device-level contact 4. In some of the embodiments, the interface between the conductive via 5 and the device-level contact 4 is free of native oxide layer.

The interconnect structure 100 further includes a conductive line 6 over each of the conductive vias 5. However it should be noted that, in some embodiments, the conductive lines 6 may not be aligned along one plane (thus not every conductive lines 6 appear on one cross sectional perspective, unlike the one shown in FIG. 1A). The conductive line 6 includes an upper portion 6' laterally surrounded by the third interlayer dielectric layer 30 and the third etch stop layer 29, and a bottom portion 6* laterally surrounded by the sidewall portion 41s of the first densified dielectric layer 41. A contact interface INT between a bottom surface of the bottom portion 6* of the conductive line 6 and the top surface of the conductive via 5 is at a level below the top surface of the second interlayer dielectric layer 20. A width of the upper portion 6' of the conductive line 6 is greater than a width of the bottom portion 6* of the conductive line 6. In some embodiments, a width WD of the upper portion 6' of the conductive line 6 is in a range from about 15 nm to about 30 nm. In some of the embodiments, the interface between the conductive via 5 and the conductive line 6 is free of native oxide layer.

In some alternative embodiments, the conductive line 6 electrically connected to the gate structure 2 may be formed in a stage different from the one forming the conductive line 6 electrically connected to the conductive regions EP. In some of the embodiments, a position of the conductive line 6 electrically connected to the gate structure 2 may not be aligned with the conductive line 6 electrically connected to the conductive regions EP. In some other embodiments, not every conductive lines 6 are aligned along an imaginary line.

The interconnect structure 100 further includes a second densified dielectric layer 42, wherein the second densified dielectric layer 42 includes a sidewall portion 42s surrounding the upper portion 6' of the conductive line 6 and a top portion 42t over the third interlayer dielectric layer 30. In some embodiments, the second densified dielectric layer 42 spaces between a sidewall of the conductive line 6 and a sidewall of the third interlayer dielectric layer 30. The second densified dielectric layer 42 may be formed by oxidizing a surface of the third interlayer dielectric layer 30. In some embodiment, a density of the second densified dielectric layer 42 is greater than a density of the third interlayer dielectric layer 30. In some embodiments, the second densified dielectric layer 42 and the third interlayer dielectric layer 30 may have a similar material, but the percentage of oxygen composition in the second densified dielectric layer 42 is greater than the same in the third interlayer dielectric layer 30. In some embodiments, a top surface of the conductive line 6 is coplanar with a top surface of the top portion 42t over the third interlayer dielectric layer 30. In some alternative embodiments, the third interlayer dielectric layer 30 includes silicon oxide (SiO$_x$), and the second densified dielectric layer 42 includes silicon oxynitrides (SiO$_x$N$_y$).

In some embodiments, the second densified dielectric layer 42 may have a low conductivity, which can be utilized as a barrier layer for alleviating leakage issue. For example, when a distance D between two conductive lines 6 is in a range from about 5 nm to 20 nm, the leakage issue may be evident when no barrier is surrounding the conductive lines 6, thereby having the second densified dielectric layer 42 may be able to alleviate the issue of leakage. A thickness of the second densified dielectric layer 42 is in a range from about 0.2 nm to about 2 nm. When a thickness of the second densified dielectric layer 42 is less than 0.2 nm, the second densified dielectric layer 42 may not effectively alleviate leakage issue; when a thickness of the second densified dielectric layer 42 is greater than 2 nm, it may increase overall k-value of the third interlayer dielectric layer 30. In some embodiments, the presence of the second densified dielectric layer 42 may be detected by microscope, Energy-dispersive X-ray spectroscopy (EDX) mapping or any other composition analysis.

Figure 2:
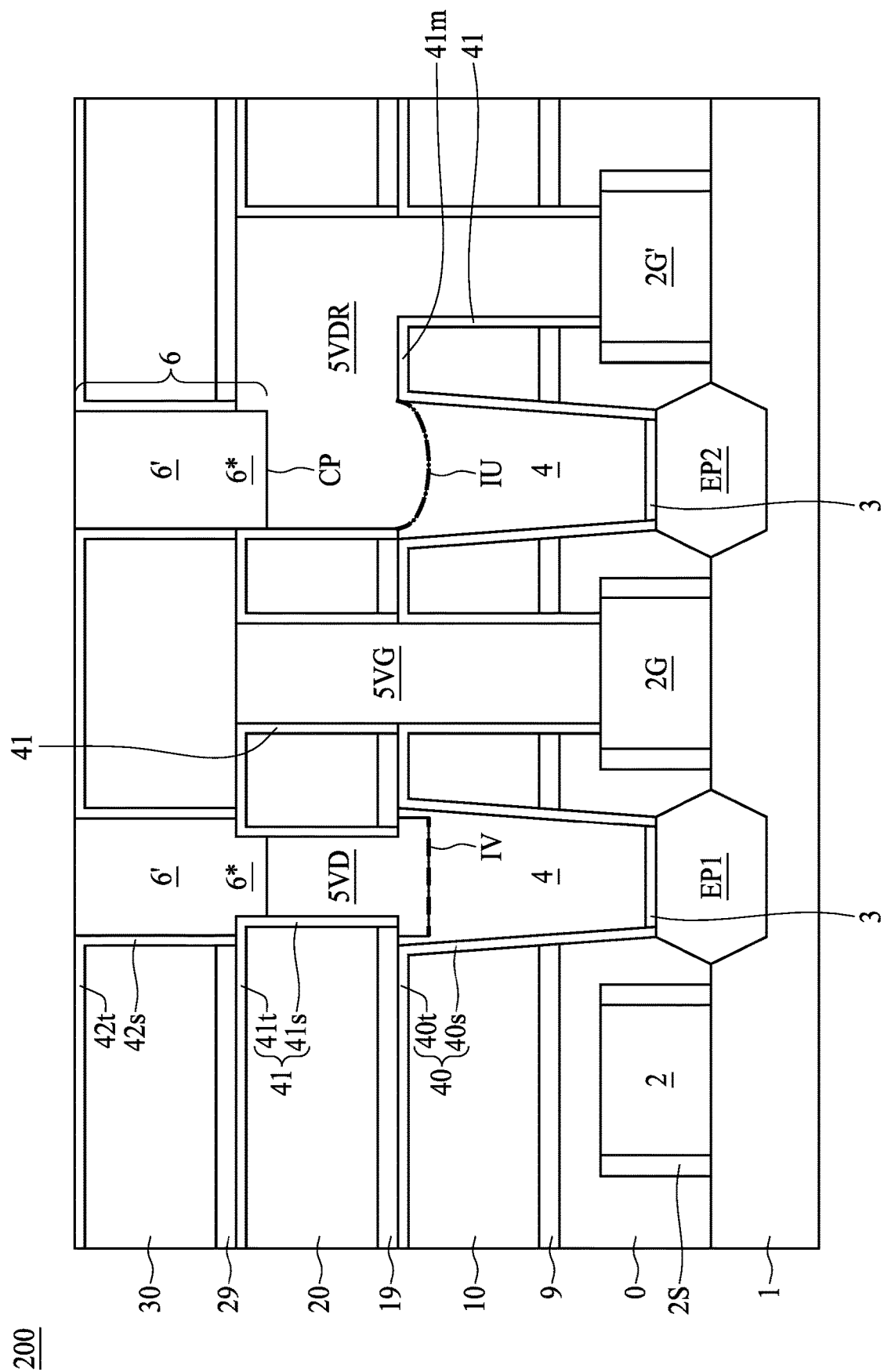
FIG. 2 is a cross sectional view of an interconnect structure, according to some embodiments of the present disclosure.

Referring to FIG. 2, FIG. 2 is a cross sectional view of an interconnect structure, according to some embodiments of the present disclosure. Identical numerals marked in the present disclosure refer to identical or substantially identical components and these components would not be repeated again for brevity. The interconnect structure 200 is similar to the interconnect structure 100 discussed in FIG. 1A to FIG. 1B, wherein one of the differences is that the interconnect structure 200 has a first conductive via 5VD electrically connected to one of the conductive regions EP (herein denoted as EP1), a second conductive via 5VG electrically connected to one of the gate structures 2 (herein denoted as 2G), and a third conductive via 5VDR electrically connected to another conductive region EP (herein denoted as EP2) and another gate structure 2 (herein denoted as 2G').

The first conductive via 5VD, the second conductive via 5VG, and the third conductive via 5VDR may include ruthenium or other low-resistivity material. The first conductive via 5VD and the third conductive via 5VDR may optionally have a bottom portion 5* in the concaved portion of the device-level contact 4. That is, a contact interface IV between a bottom surface of the first conductive via 5VD and the device-level contact 4, and/or a contact interface IU between a bottom surface of the third conductive via 5VDR and the device-level contact 4, is at a level below the top surface of the first interlayer dielectric layer 10. In some embodiments, the third conductive via 5VDR may have a concaved portion CP at the top portion, and a bottom portion 6* of an overlying conductive line 6 is disposed in the concaved portion. The second conductive via 5VG is disposed directly above the gate structure 2G, and penetrates the second interlayer dielectric layer 20, the first interlayer dielectric layer 10, and a portion of the passivation layer 0. The second conductive via 5VG is laterally surrounded by the first densified dielectric layer 41. The third conductive via 5VDR and an upper portion of the first conductive via 5VD is laterally surrounded by the first densified dielectric layer 41. In some embodiments, a top surface of the second conductive via 5VG and a portion of a top surface of the third conductive via 5VDR are coplanar with a top surface of the top portion 41t of the first densified dielectric layer 41. A top surface of the first conductive via 5VD may be below the top surface of the second interlayer dielectric layer 20. In some embodiments, the first densified dielectric layer 41 further include a portion 41m spacing between the third conductive via 5VDR and a top surface of the first interlayer dielectric layer 10.

Figure 3A:
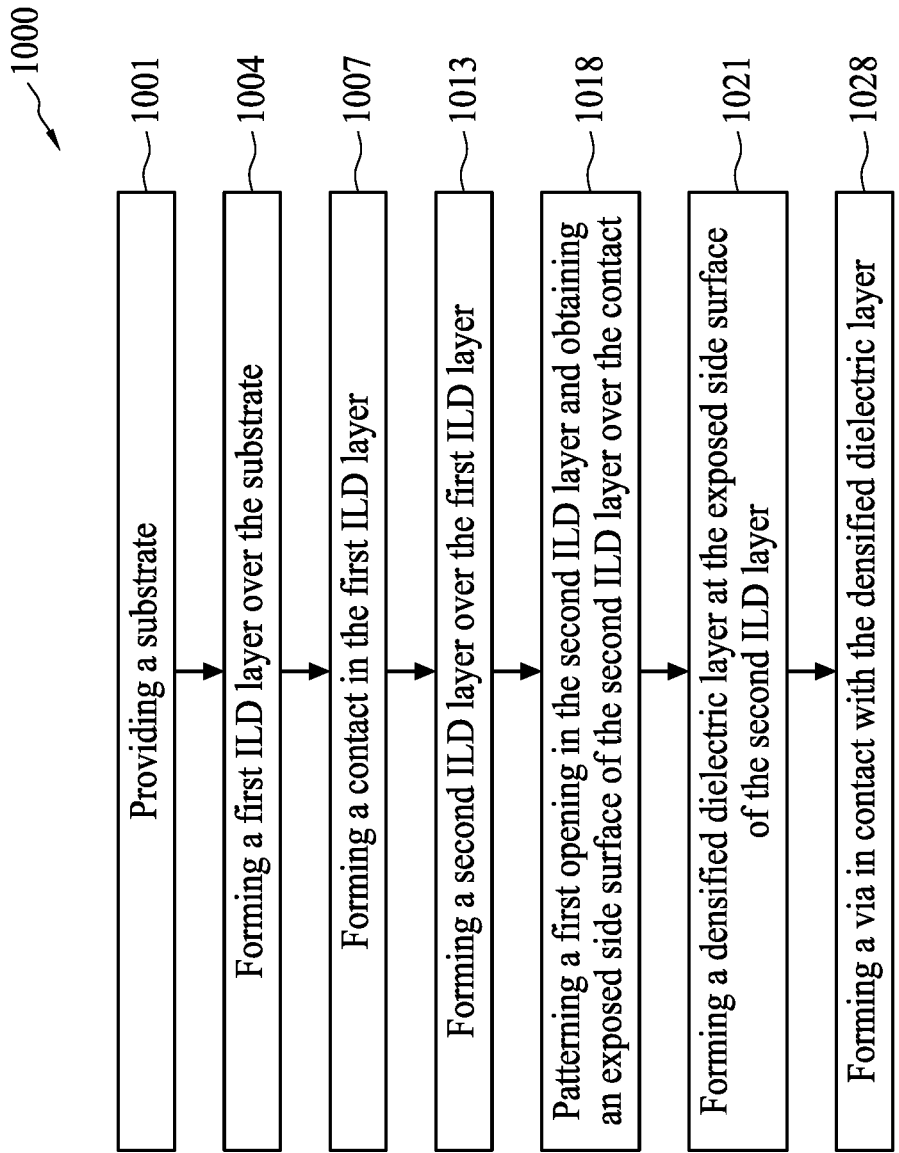
FIG. 3A shows a flow chart representing method of fabricating an interconnect structure, in accordance with some embodiments of the present disclosure.

Referring to FIG. 3A, FIG. 3A shows a flow chart representing method of fabricating a semiconductor device, in accordance with some embodiments of the present disclosure. The method 1000 for fabricating an interconnect structure includes providing a substrate (operation 1001, which can be referred to FIG. 4), forming a first ILD layer over the substrate (operation 1004, which can be referred to FIG. 5), forming a contact in the first ILD layer (operation 1007, which can be referred to FIG. 6A to FIG. 6C or FIG. 7A to FIG. 7C), forming a second ILD layer over the first ILD layer (operation 1013, which can be referred to FIG. 6D or FIG. 7D), patterning a first opening in the second ILD layer and obtaining an exposed side surface of the second ILD layer over the contact (operation 1018, which can be referred to FIG. 6E or FIG. 7E), forming a densified dielectric layer at the exposed side surface of the second ILD layer (operation 1021, which can be referred to FIG. 6F or FIG. 7F), and forming a via in contact with the densified dielectric layer (operation 1028, which can be referred to FIG. 6H to FIG. 6I or FIG. 7H to FIG. 7I).

Figure 3B:
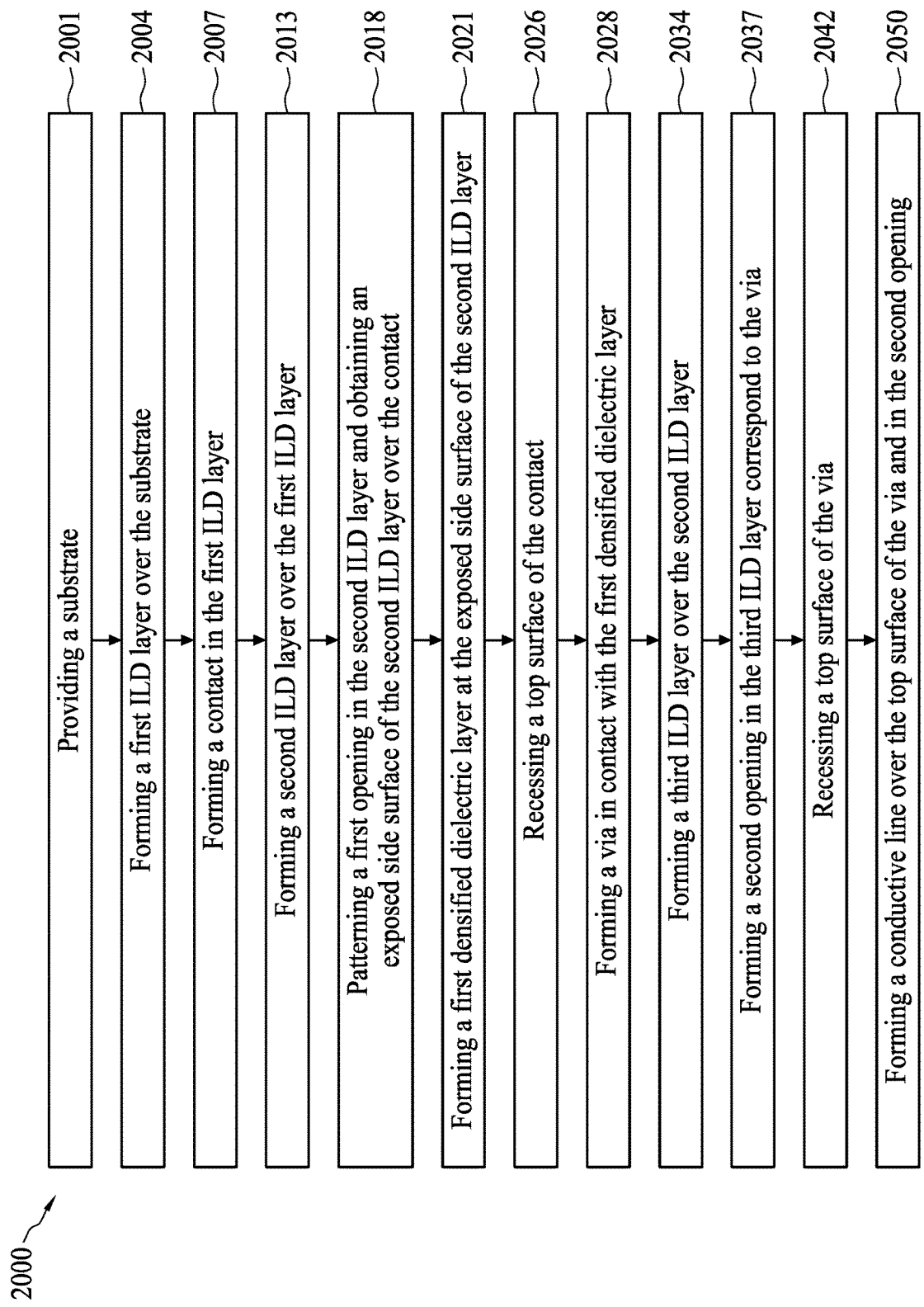
FIG. 3B shows a flow chart representing method of fabricating an interconnect structure, in accordance with some embodiments of the present disclosure.

Referring to FIG. 3B, FIG. 3B shows a flow chart representing method of fabricating a semiconductor device, in accordance with some embodiments of the present disclosure. The method 2000 for fabricating an interconnect structure includes providing a substrate (operation 2001, which can be referred to FIG. 4), forming a first ILD layer over the substrate (operation 2004, which can be referred to FIG. 5), forming a contact in the first ILD layer (operation 2007, which can be referred to FIG. 6A to FIG. 6C or FIG. 7A to FIG. 7C), forming a second ILD layer over the first ILD layer (operation 2013, which can be referred to FIG. 6D or FIG. 7D), patterning a first opening in the second ILD layer and obtaining an exposed side surface of the second ILD layer over the contact (operation 2018, which can be referred to FIG. 6E or FIG. 7E), forming a first densified dielectric layer at the exposed side surface of the second ILD layer (operation 2021, which can be referred to FIG. 6F or FIG. 7F), recessing a top surface of the contact (operation 2026, which can be referred to FIG. 6H or FIG. 7H), forming a via in contact with the first densified dielectric layer (operation 2028, which can be referred to FIG. 6H to FIG. 6I or FIG. 7H to FIG. 7I), forming a third ILD layer over the second ILD layer (operation 2034, which can be referred to FIG. 6J or FIG. 7G), forming a second opening in the third ILD layer correspond to the via (operation 2037, which can be referred to FIG. 6K or FIG. 7K), recessing a top surface of the via (operation 2042, which can be referred to FIG. 6M or FIG. 7M), and forming a conductive line over the top surface of the via and in the second opening (operation 2050, which can be referred to FIG. 6N to FIG. 6O or FIG. 7N to FIG. 7O).

Figure 4:
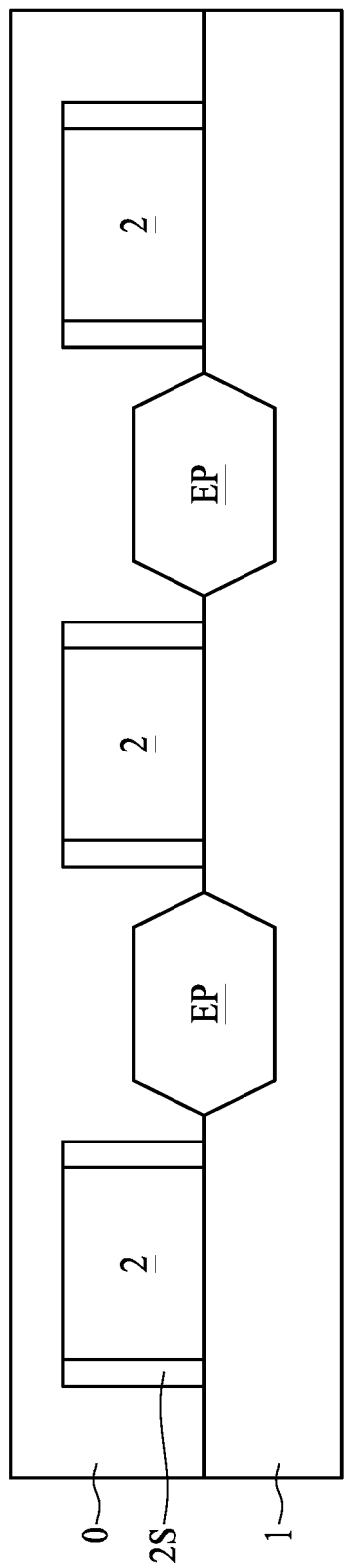
FIG. 4 is a cross sectional view of an interconnect structure during intermediate stages of manufacturing operations, according to some embodiments of the present disclosure.
Figure 5:
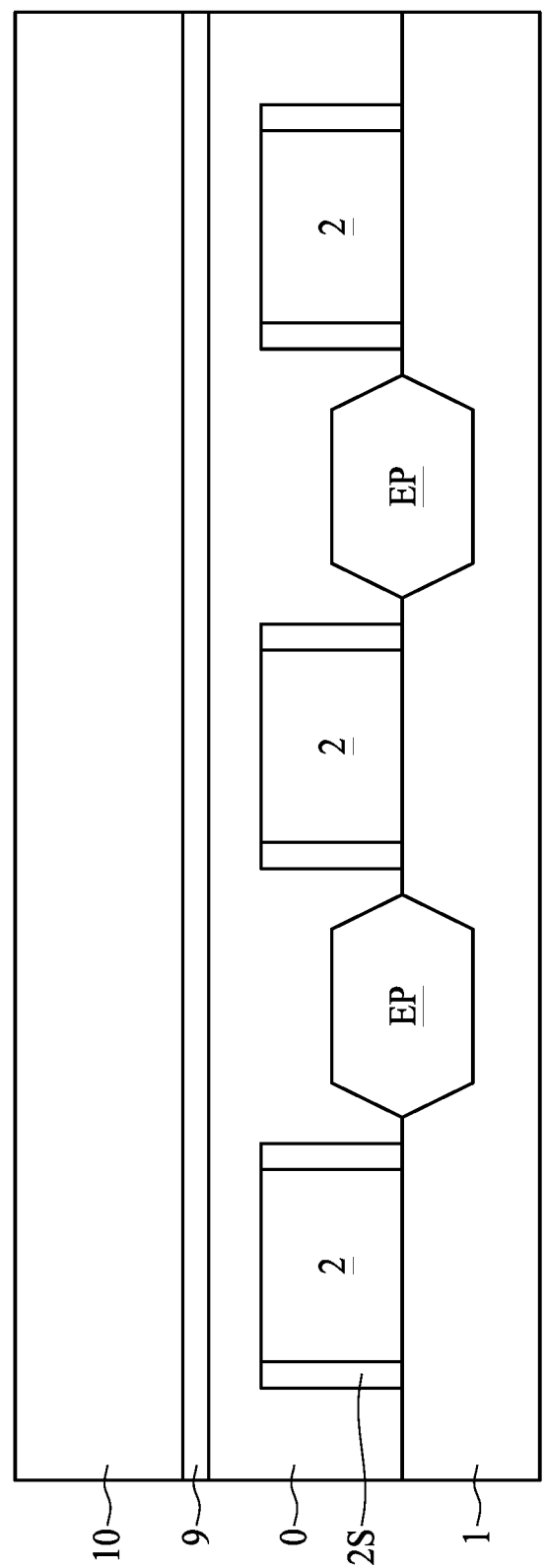
FIG. 5 is a cross sectional view of an interconnect structure during intermediate stages of manufacturing operations, according to some embodiments of the present disclosure.

Referring to FIG. 4, FIG. 4 is a cross sectional view of an interconnect structure during intermediate stages of manufacturing operations, according to some embodiments of the present disclosure. A substrate 1 is provided, and the conductive regions EP as well as the gate structures 2 adjacent to the conductive regions EP are formed. In some embodiments, the gate structures 2 are metal gate structures, and can be formed by replacement gate operation. For example, sacrificial gates (not shown in FIG. 4) are formed over the substrate 1, spacers 2S are formed to cover sidewalls of the sacrificial gates, conductive regions EP are formed by epitaxial growth technique, and a passivation layer 0 is formed over the substrate 1 to surround the sacrificial gates and the spacers 2S. Subsequently, the sacrificial gates are removed and replaced by conductive materials, and planarization operation (such as CMP) is performed from top surface to remove excessive conductive materials. Thereby the gate structures 2 are formed. However, the aforementioned replacement gate operation is one of the examples of forming gate structures. In some alternative embodiments, the formation of gate structures 2 may be by other gate first operation, gate last operation, or hybrid gate last/gate first, depending on requirement of gate functions, technology nodes and design rules. In some alternative embodiments, some poly gates can be formed over the substrate 1. Referring to FIG. 5, FIG. 5 is a cross sectional view of an interconnect structure during intermediate stages of manufacturing operations, according to some embodiments of the present disclosure. A first etch stop layer 9 is formed over the passivation layer 0 and the gate structures 2. A first interlayer dielectric layer 10 is formed over the first etch stop layer 9. The material of the first interlayer dielectric layer 10 and the first etch stop layer 9 can be referred back to FIG. 1A to FIG. 1B.

Figure 6A:
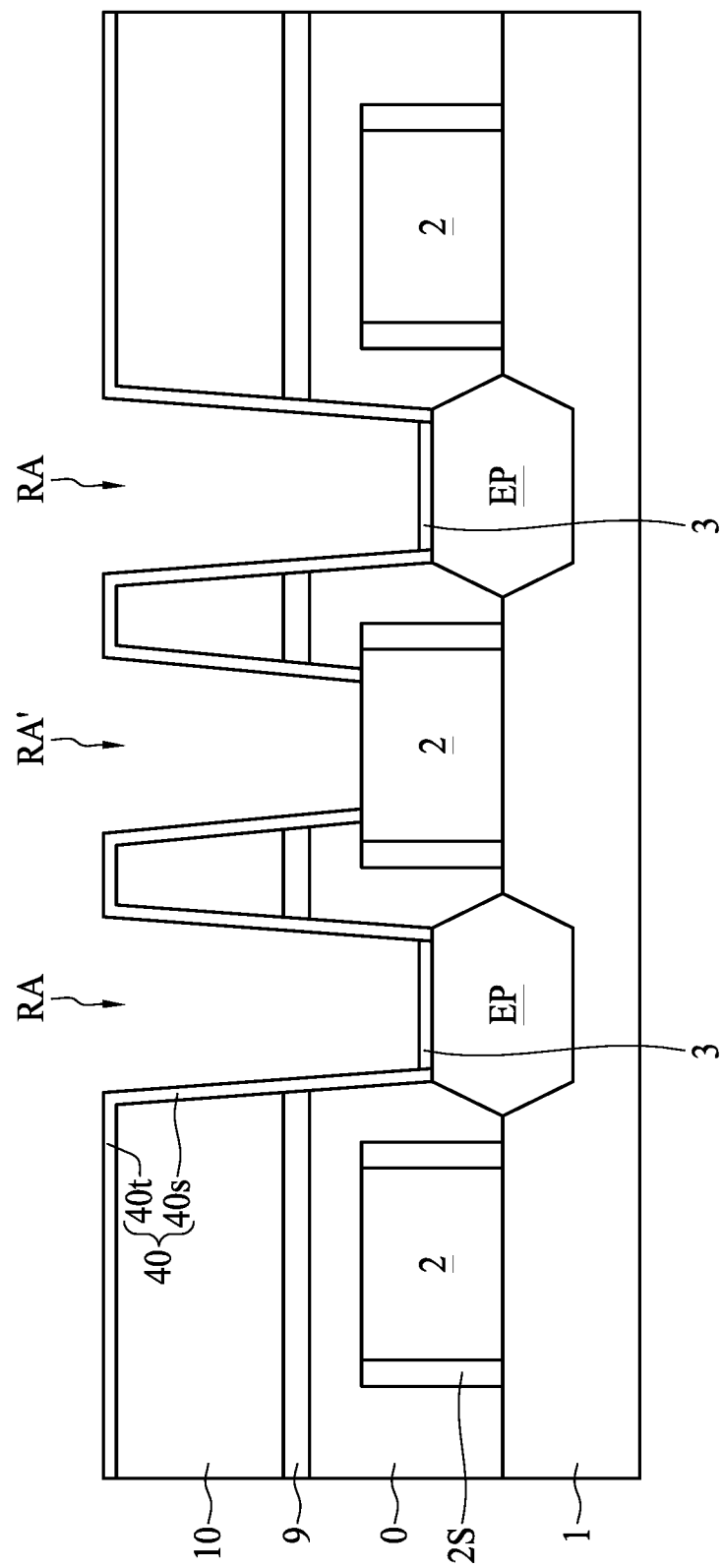
FIG. 6A to FIG. 6O are cross sectional views of an interconnect structure during intermediate stages of manufacturing operations, according to some embodiments of the present disclosure.
Figure 6B:
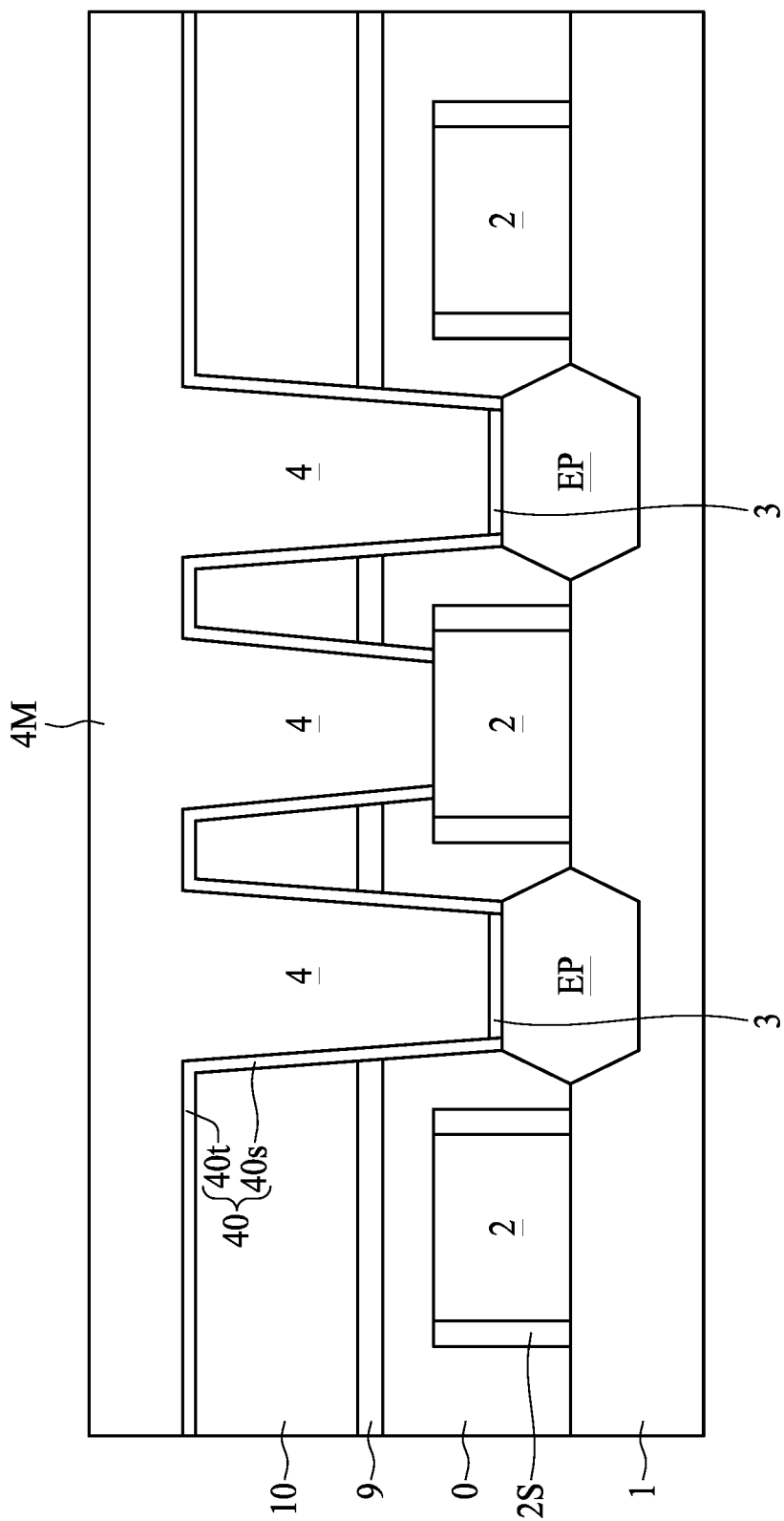
Figure 6C:
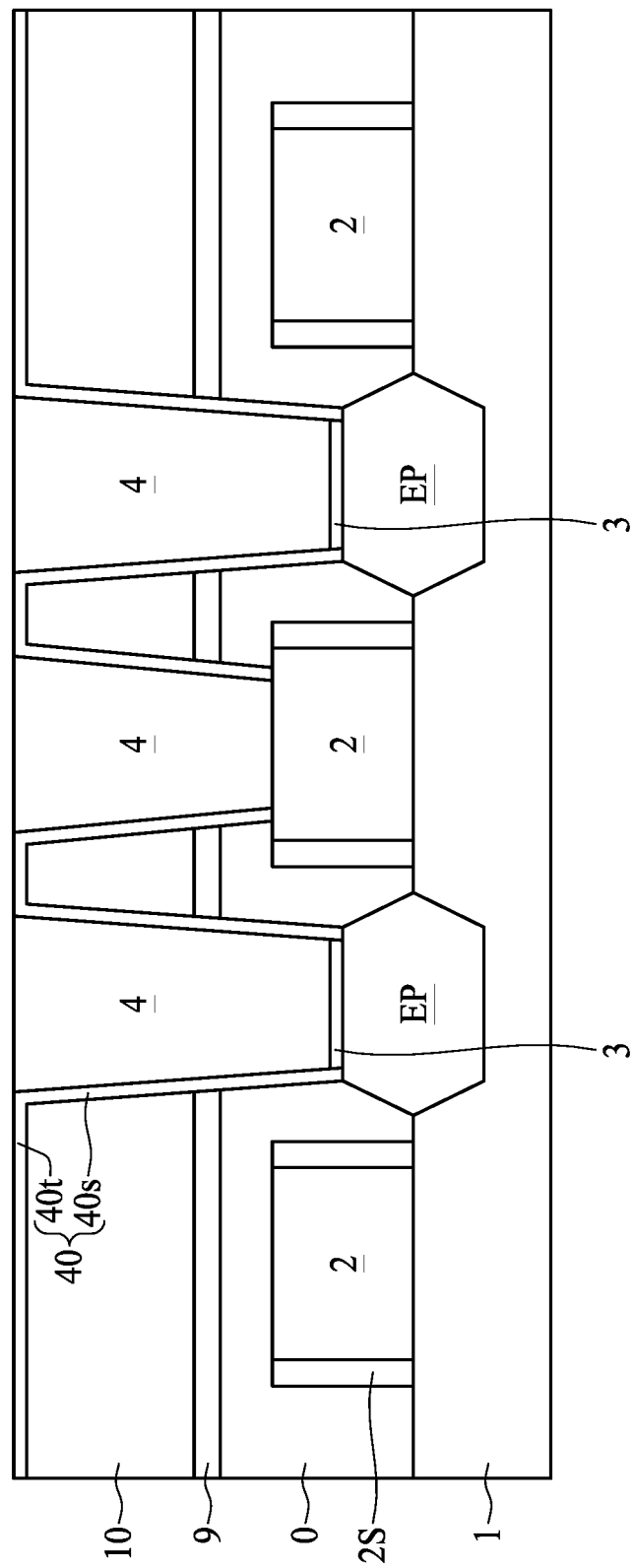
Figure 6D:
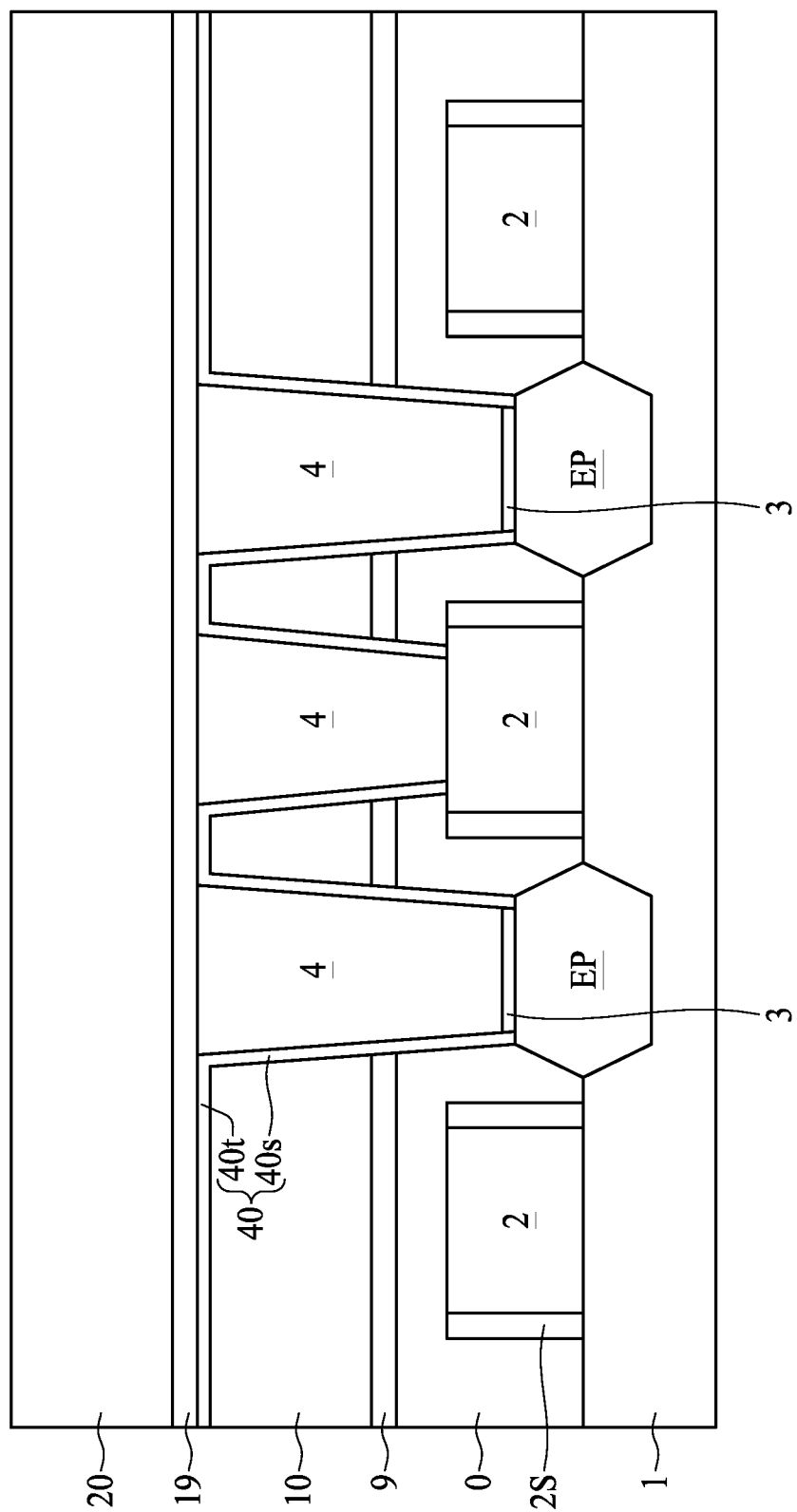
Figure 6E:
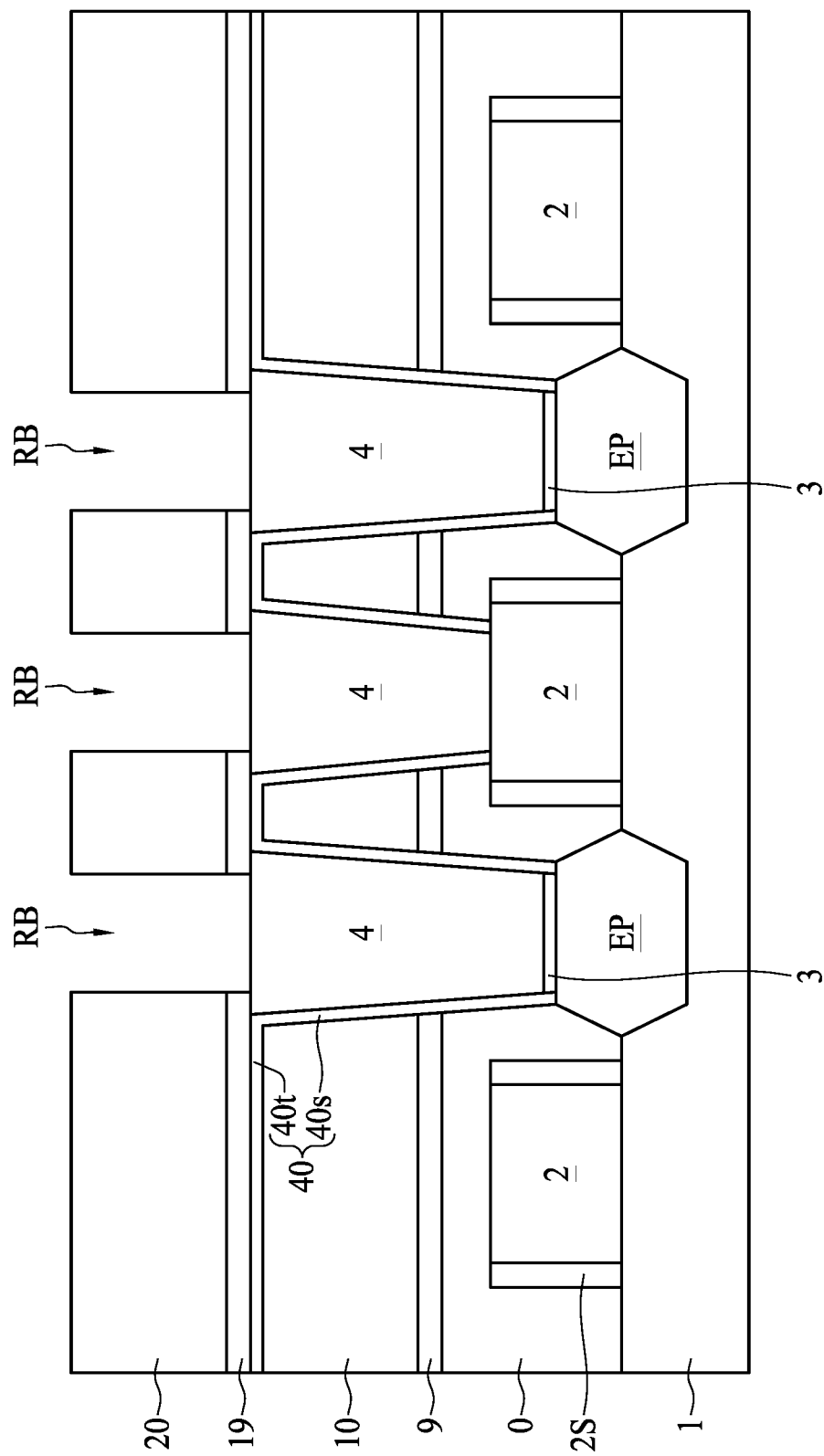
Figure 6F:
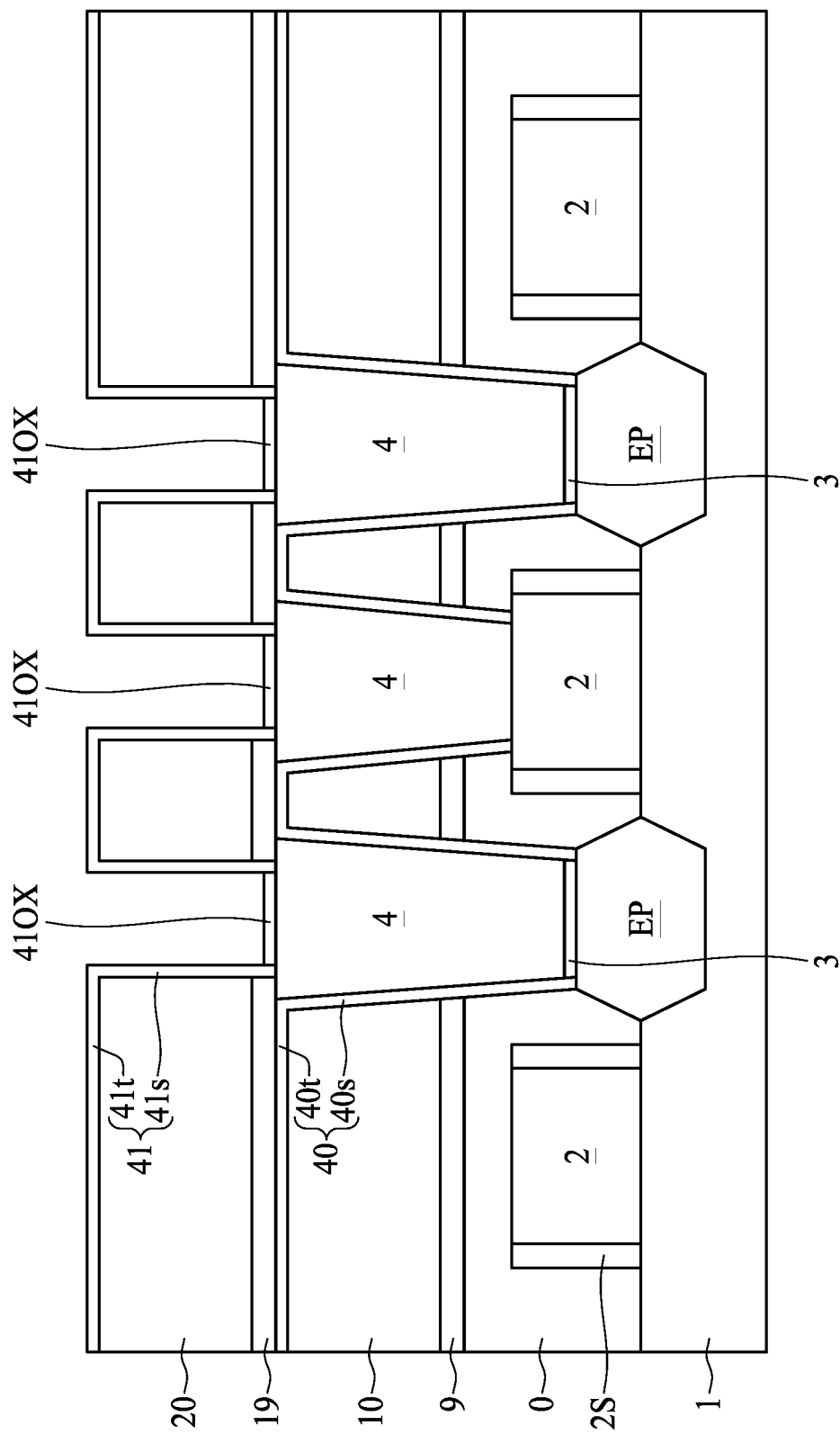
Figure 6G:
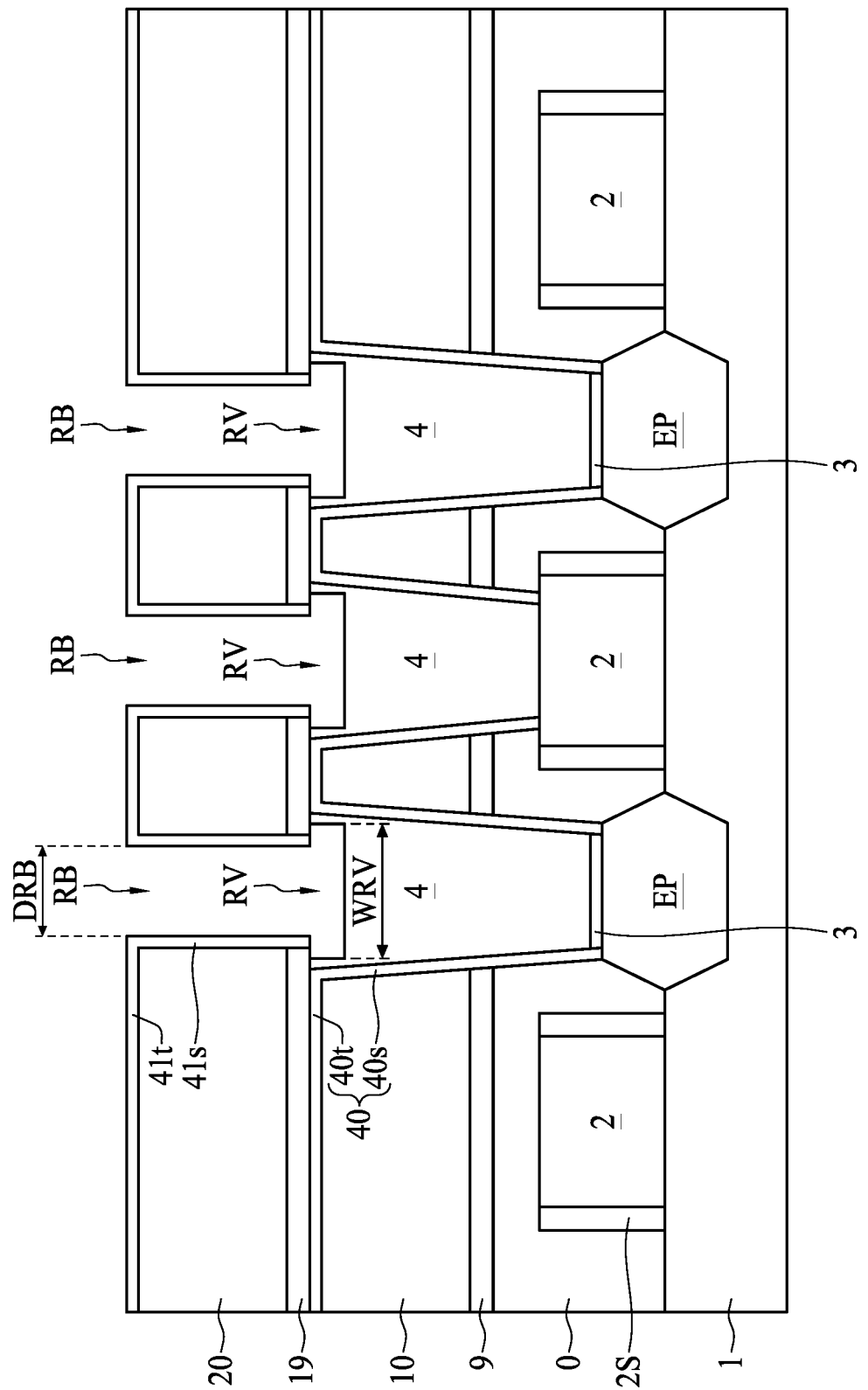
Figure 6H:
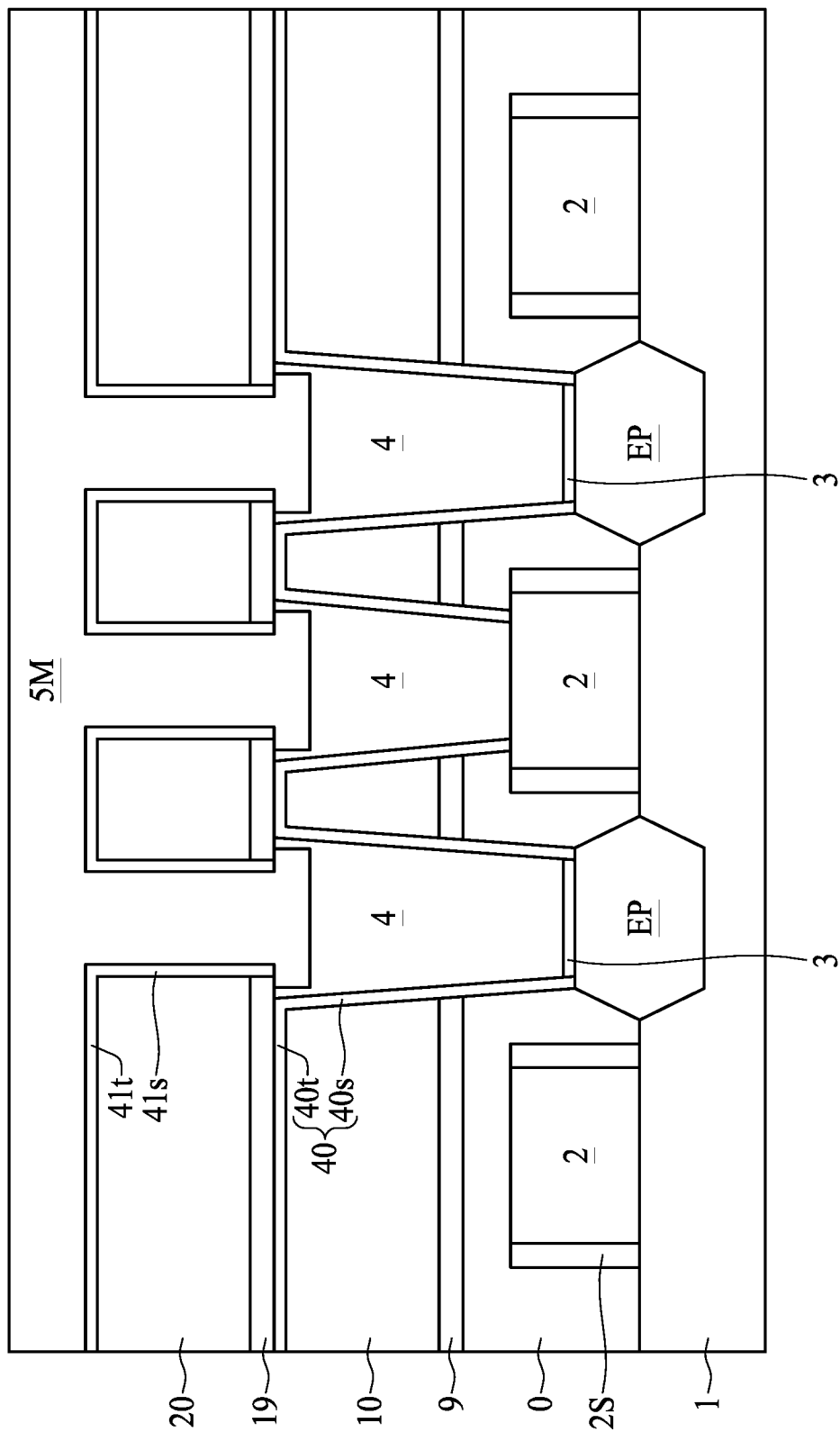
Figure 6I:
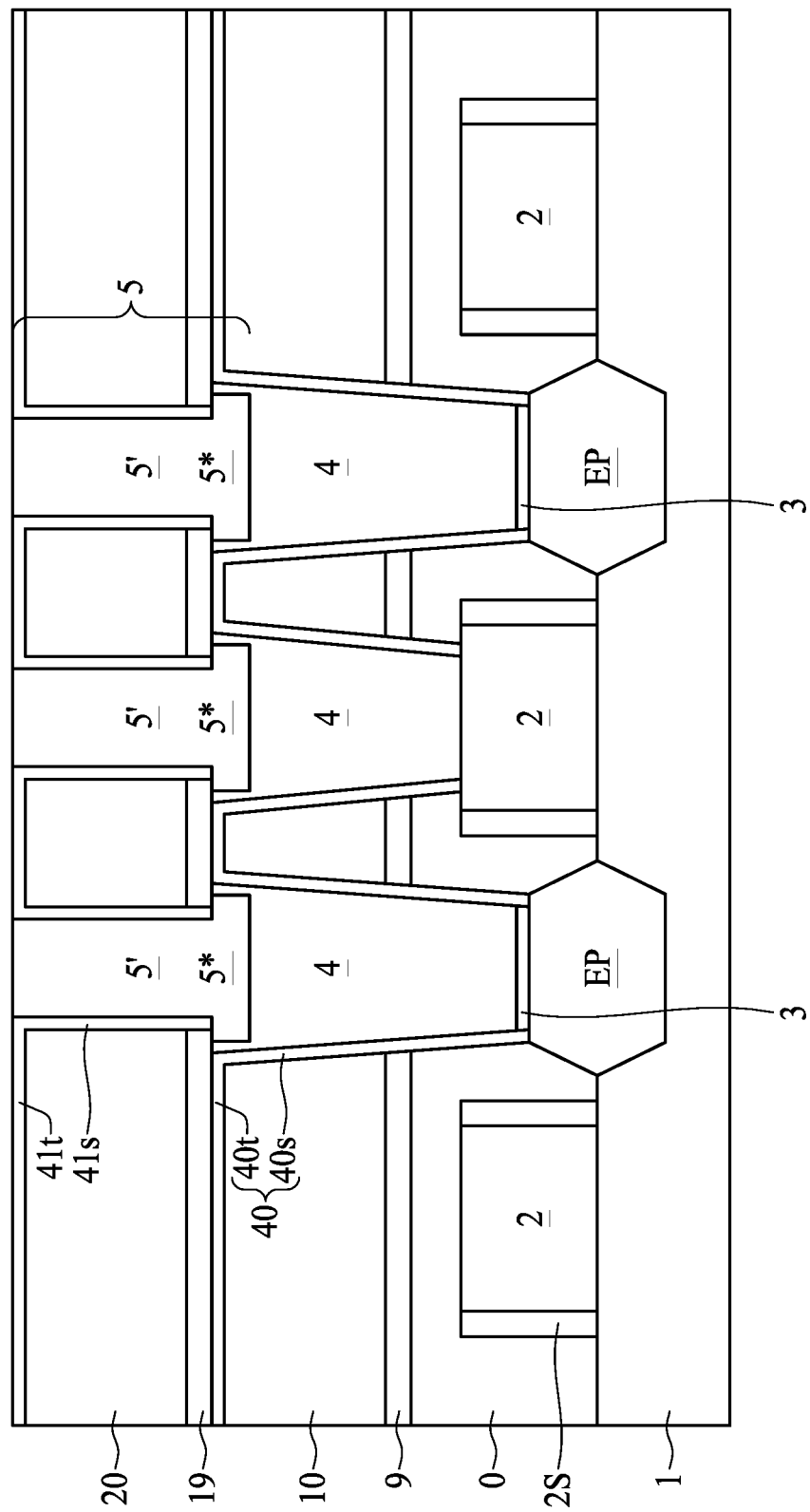
Figure 6J:
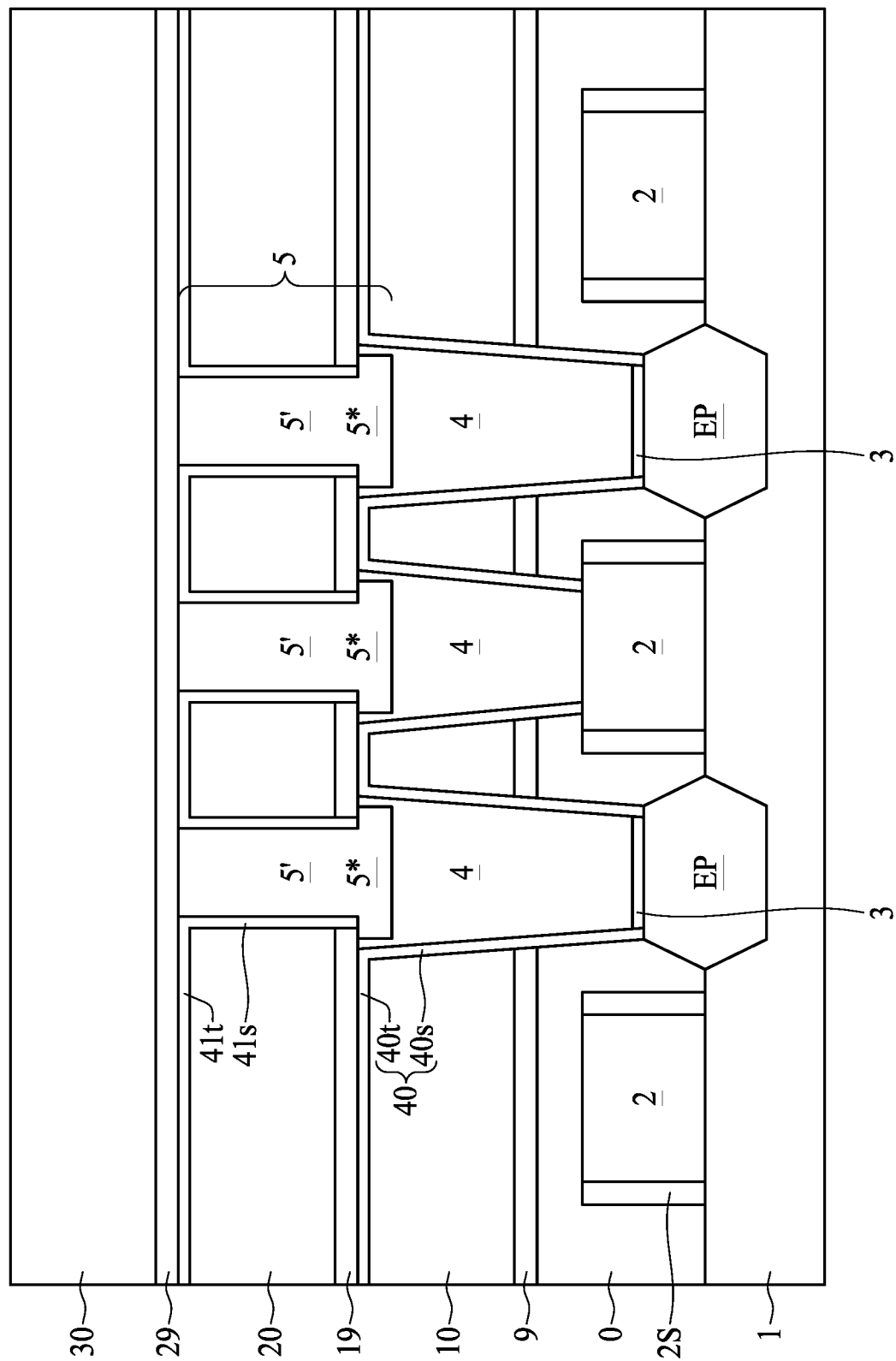
Figure 6K:
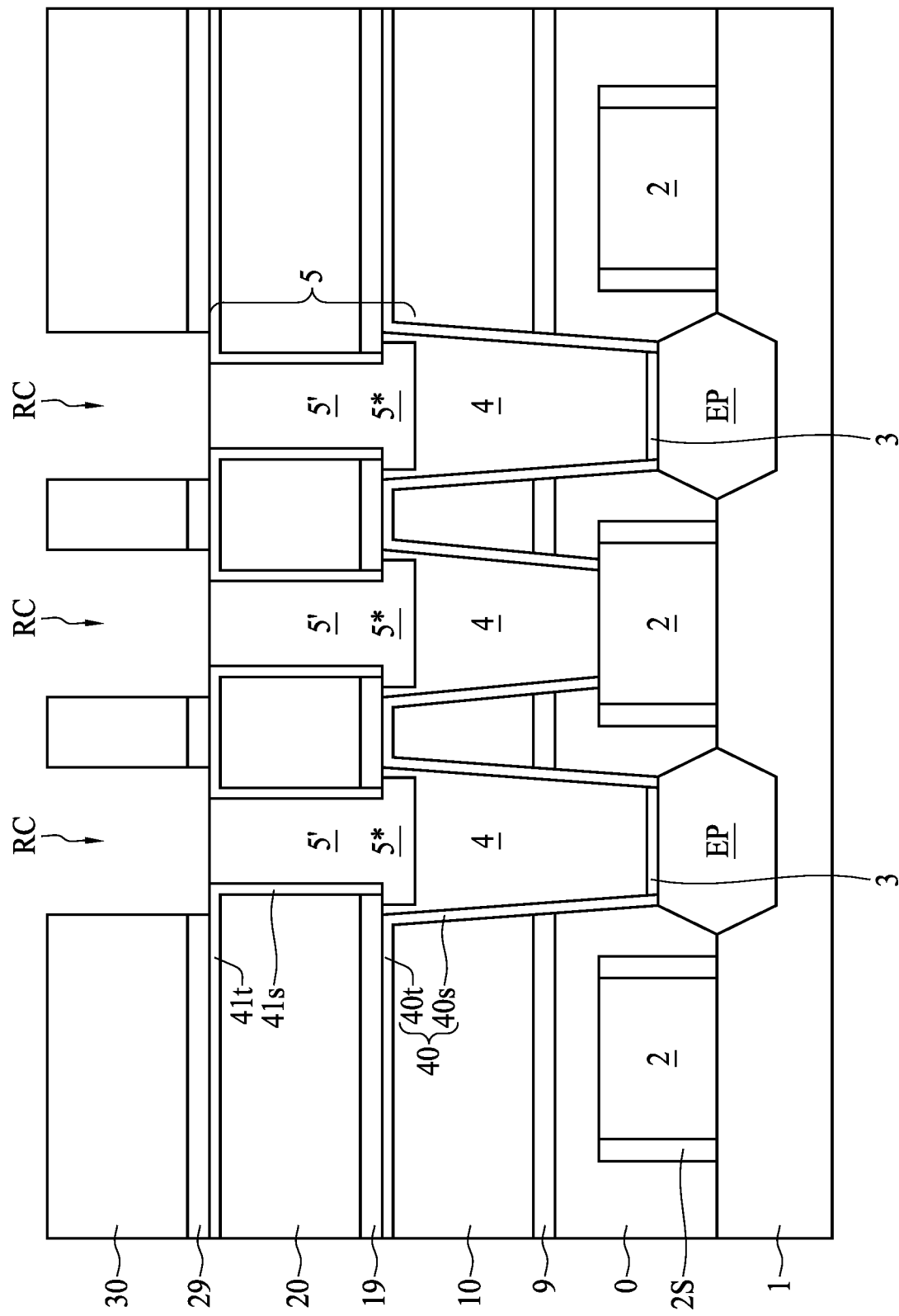
Figure 6L:
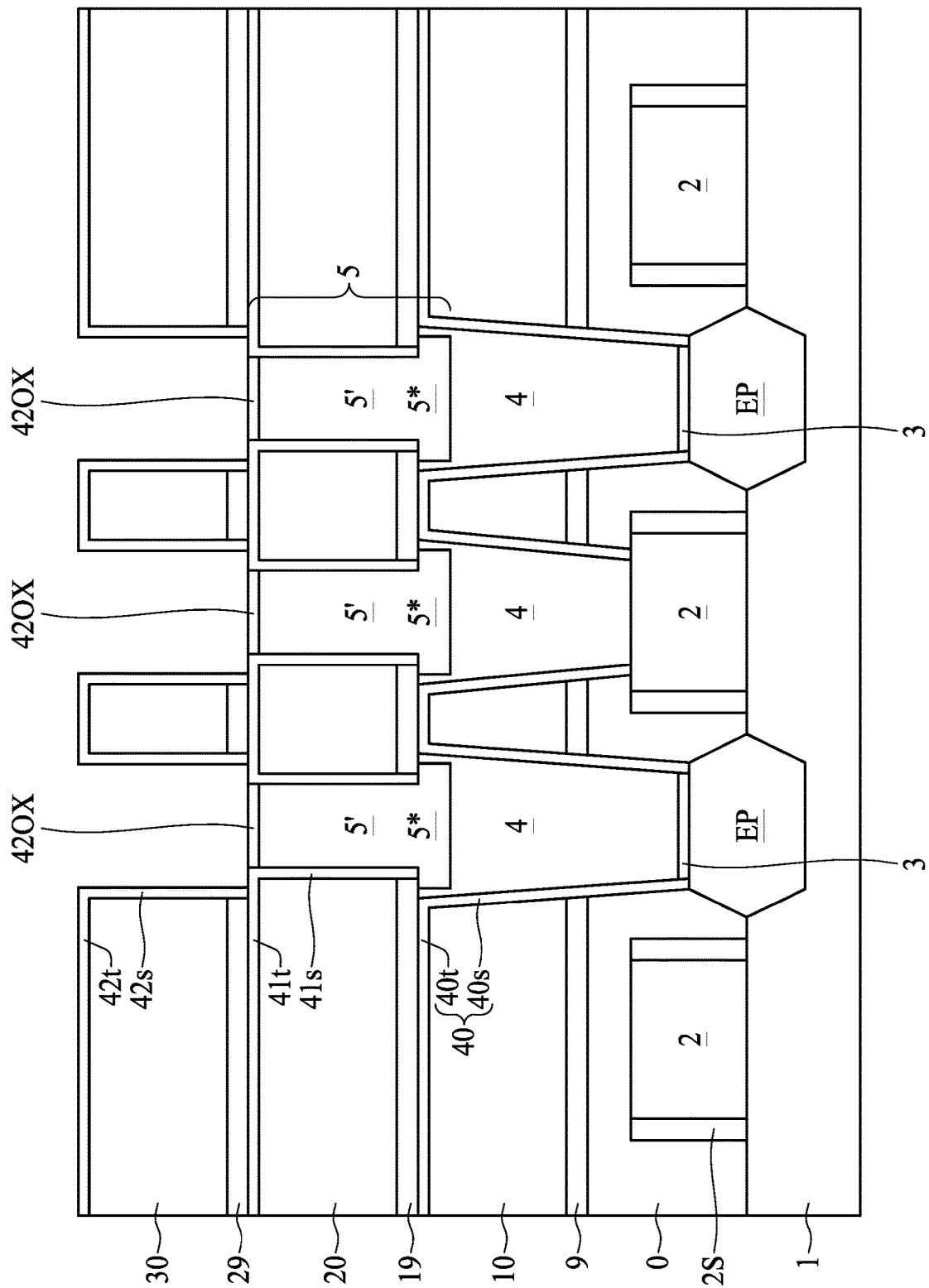
Figure 6M:
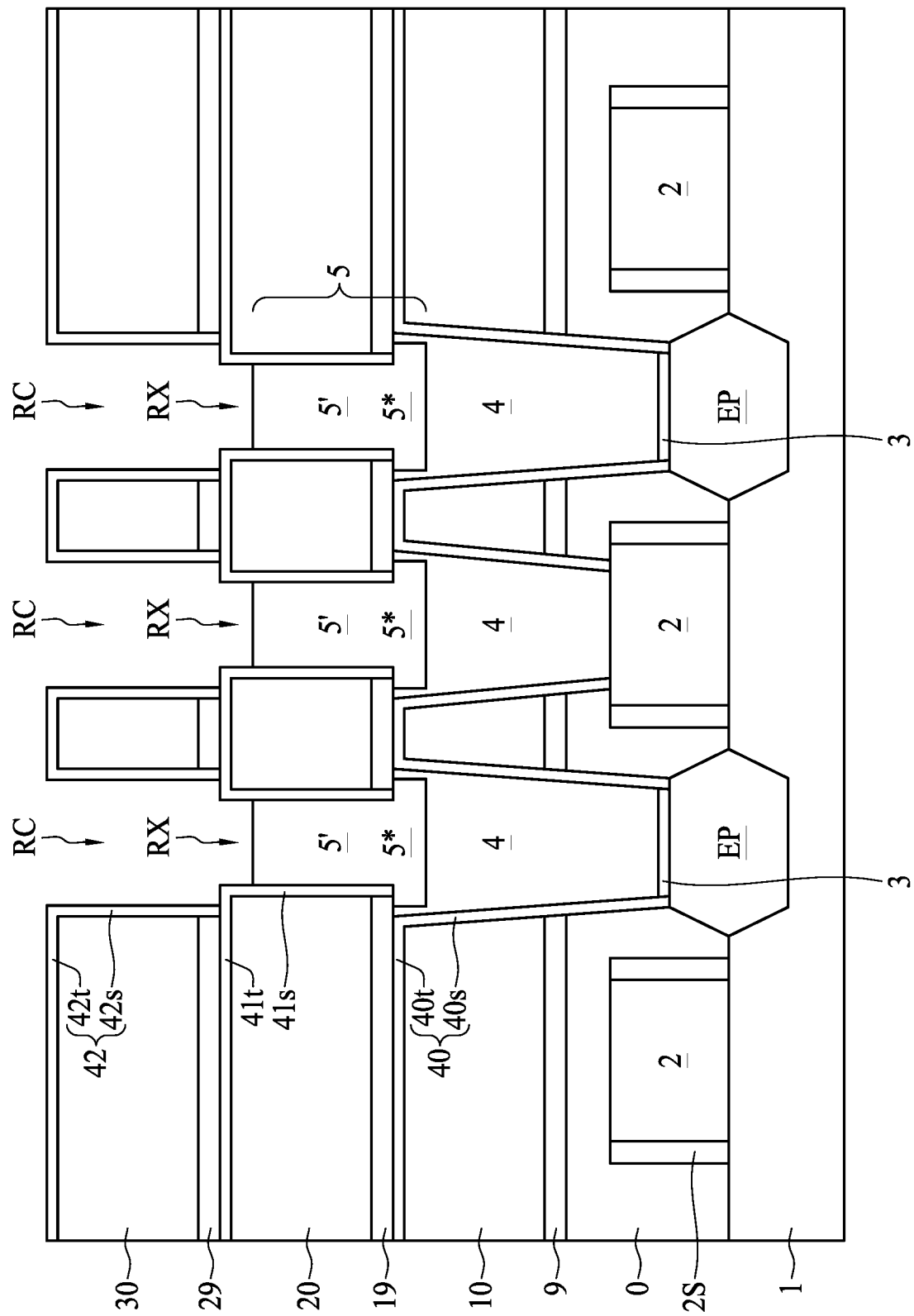
Figure 6N:
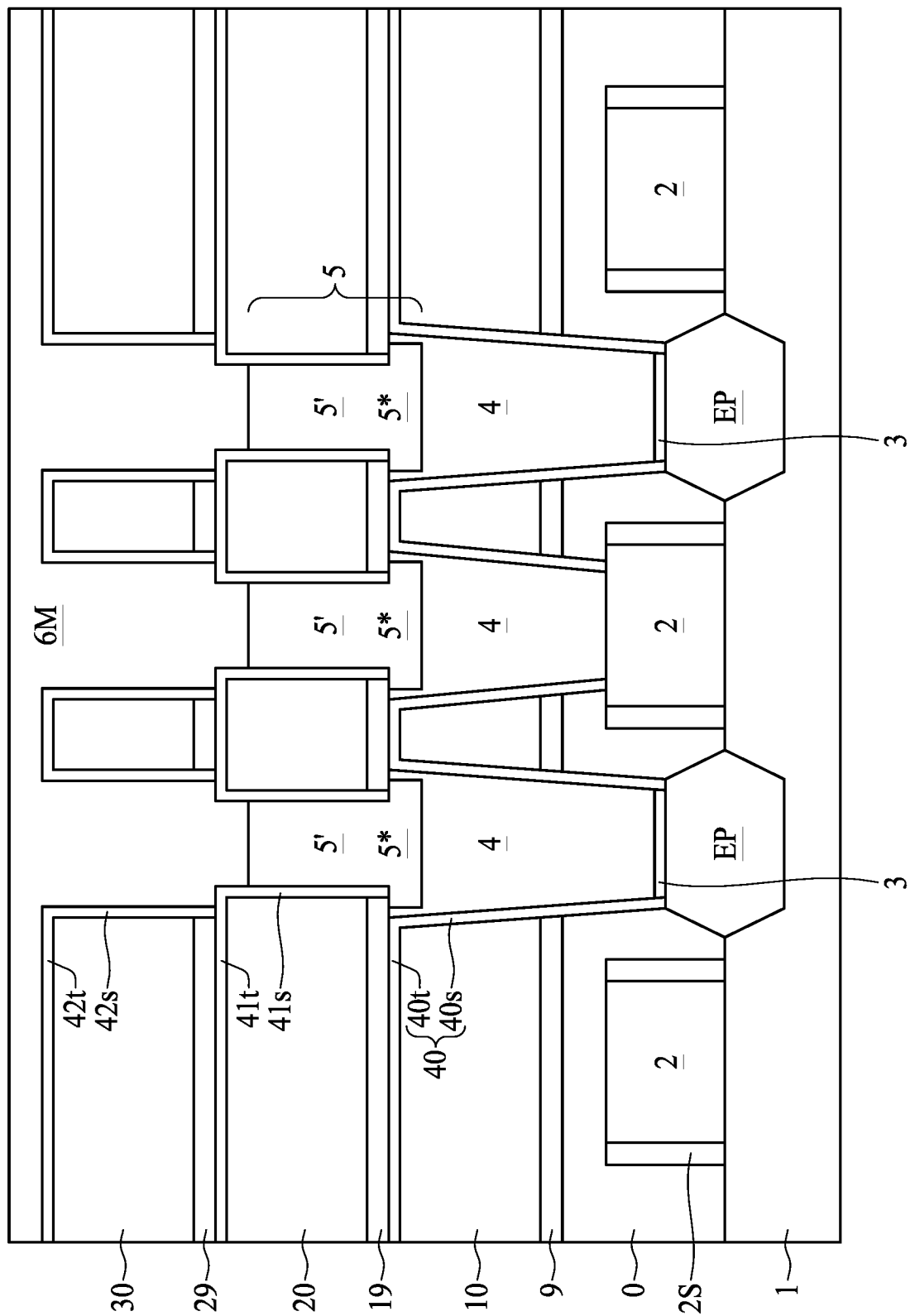
Figure 6O:
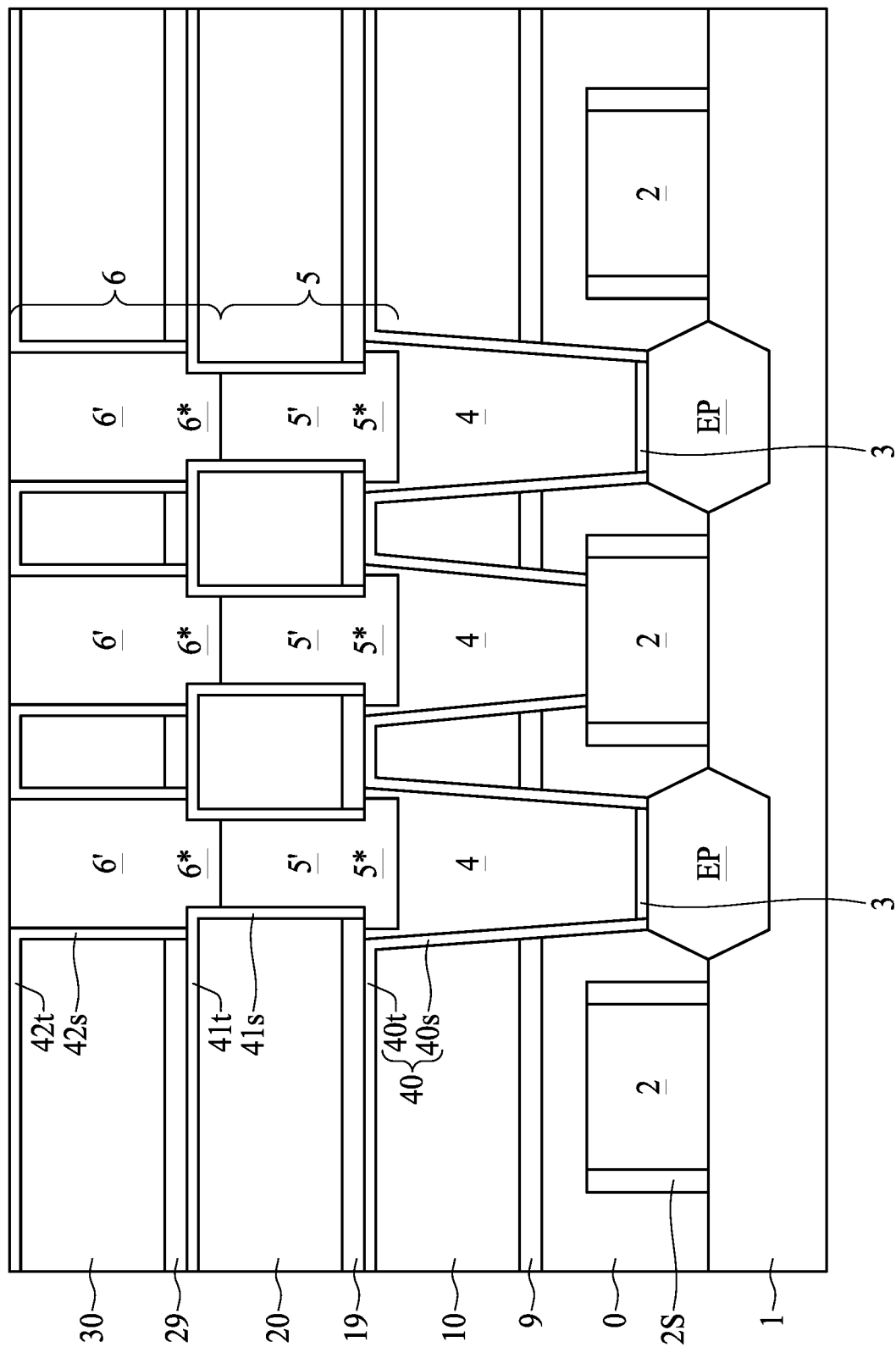
Figure 7A:
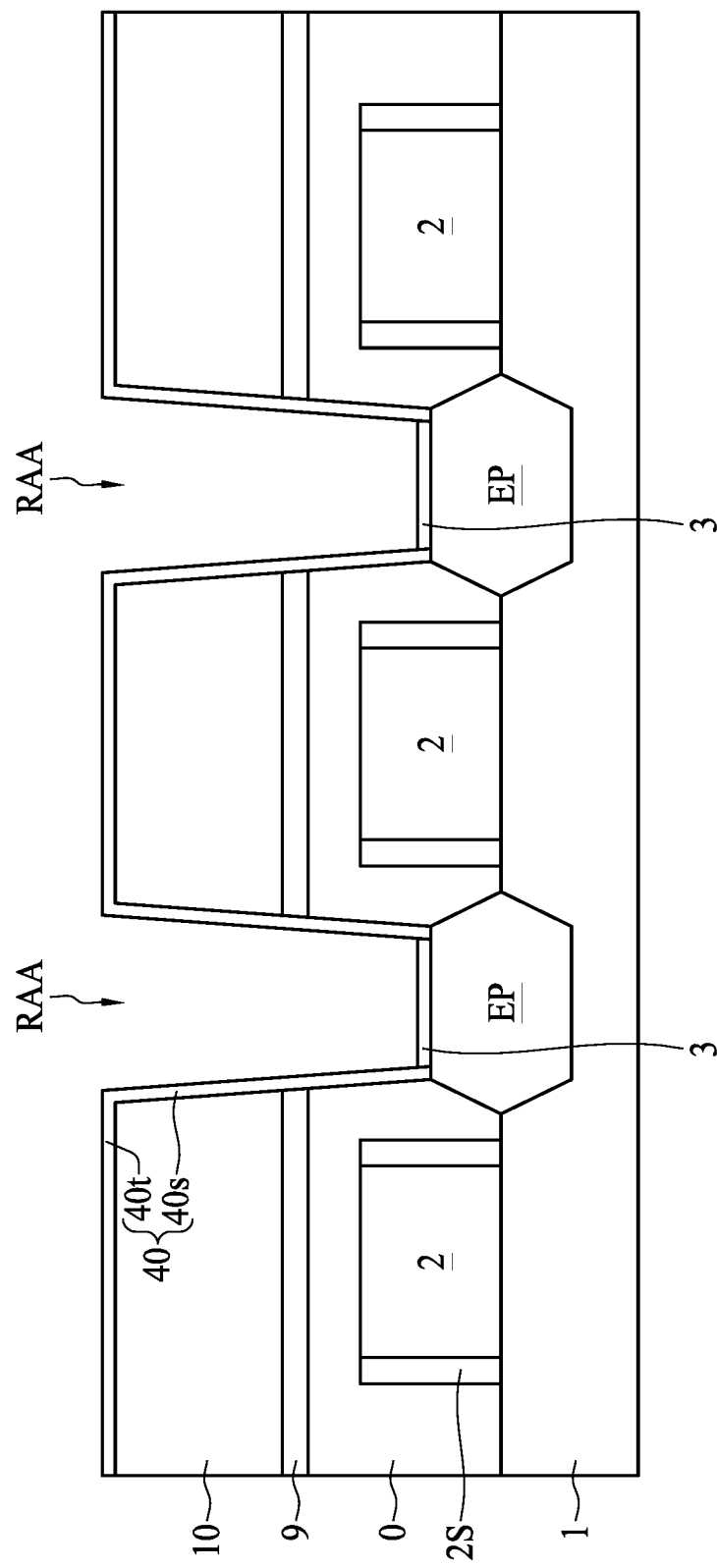
FIG. 7A to FIG. 7O are cross sectional views of an interconnect structure during intermediate stages of manufacturing operations, according to some embodiments of the present disclosure.

FIG. 6A to FIG. 6O illustrates a method for fabricating an interconnect structure (such as interconnect structure 100 discussed in FIG. 1A to FIG. 1B) in subsequent to the operations discussed in FIG. 4 to FIG. 5; FIG. 7A to FIG. 7O illustrates another method for fabricating an interconnect structure (such as interconnect structure 200 discussed in FIG. 2) in subsequent to the operations discussed in FIG. 4 to FIG. 5.

Referring to FIG. 6A, FIG. 6A is a cross sectional view of an interconnect structure during intermediate stages of manufacturing operations, according to some embodiments of the present disclosure. Subsequent to the operations discussed in FIG. 4 to FIG. 5, the first interlayer dielectric layer 10 is patterned to form via holes RA over the conductive regions EP and a via hole RA' over the gate structures 2. Herein the first etch stop layer 9 is utilized to alleviate the issue of over etching. A top surface of the gate structures 2 and top surfaces of the conductive regions EP are exposed. Silicide layers 3 are formed over the exposed top surfaces of the conductive regions EP. In some embodiments, a zeroth densified dielectric layer 40 is formed over the exposed surface of the first interlayer dielectric layer 10. Specifically, the zeroth densified dielectric layer 40 includes a sidewall portion 40s on an inner sidewall of the via holes RA and RA', and a top portion 40t over the first interlayer dielectric layer 10. In some embodiments, the zeroth densified dielectric layer 40 is formed by performing oxidation operation on the exposed surfaces of the first interlayer dielectric layer 10. The oxidation operation may include irradiating a microwave on the first interlayer dielectric layer 10, wherein the operational temperature of the microwave is in a range from about 300° C. to about 400° C. Generally speaking, at the stage of BEOL fabrication operation, low processing temperature is desired. Therefore, in a comparative embodiment, performing an annealing operation over 400° C. to oxidize dielectric layers may deteriorate the performance of semiconductor device. Furthermore, microwave is a relatively mild operation that involve ionic radical interaction over the exposed surfaces of the first interlayer dielectric layer 10 (comparing to plasma bombardment). In another comparative embodiment, oxidizing the first interlayer dielectric layer 10 using plasma may impose physical bombardment over surfaces of dielectric layers, which may lead to reliability or current leakage issues. In some embodiments, during the oxidation operation, native oxide layer (not shown in FIG. 6A) may be formed over a top surface of the gate structure 2. In addition, microwave oxidation can form the zeroth dielectric layer 40 with a thickness of from about 0.2 nm to about 2 nm, in order to obtain the benefit previously discussed. It is easier to achieve such shallow oxidation by using microwave than plasma or other conventional approaches.

In some alternative embodiments, the first interlayer dielectric layer 10 includes silicon oxide ($SiO_x$), and a nitrification operation is performed to convert a surface of the first interlayer dielectric layer 10 into silicon oxynitrides ($SiO_xN_y$) to form the zeroth densified dielectric layer 40.

In some embodiments, the native oxide layer (if presents) over the gate structure 2 is entirely or partially removed to achieve lower resistance. The native oxide layer can be removed by applying pre-clean chemical or tungsten hexafluoride ($WF_6$). In some of the embodiments, a top surface of the gate structure 2 may be recessed (not shown in FIG. 6A). The native oxide layer over the gate structures 2 may be partially or entirely removed. In some embodiments, the recessing of the device-level contact 4 can be performed by applying pre-clean chemical or tungsten hexafluoride ($WF_6$).

Referring to FIG. 6B, FIG. 6B is a cross sectional view of an interconnect structure during intermediate stages of manufacturing operations, according to some embodiments of the present disclosure. A first conductive material 4M is filled into the via holes RA and via hole RA', and further covers a top surface of the first interlayer dielectric layer 10. In some embodiments, the first conductive material 4M include tungsten. In some other alternative embodiments, the first conductive material 4M include cobalt or other types of conductive materials. Referring to FIG. 6C, FIG. 6C is a cross sectional view of an interconnect structure during intermediate stages of manufacturing operations, according to some embodiments of the present disclosure. A planarization operation, such as CMP, is performed to remove excessive portion of the first conductive material 4M. The device-level contacts 4 are thereby formed over the conductive regions EP and gate structure 2. Each of the top surface of the device-level contact 4 are coplanar. The device-level contacts 4 are surrounded by the zeroth densified layer 40.

Referring to FIG. 6D, FIG. 6D is a cross sectional view of an interconnect structure during intermediate stages of manufacturing operations, according to some embodiments of the present disclosure. A second etch stop layer 19 is formed over the first interlayer dielectric layer 10, and the device-level contact 4. A second interlayer dielectric layer 20 is formed over the second etch stop layer 19. The material of the second interlayer dielectric layer 20 and the second etch stop layer 19 can be referred back to FIG. 1A to FIG. 1B.

Referring to FIG. 6E, FIG. 6E is a cross sectional view of an interconnect structure during intermediate stages of manufacturing operations, according to some embodiments of the present disclosure. First openings RB are formed in the second interlayer dielectric layer 20 over each of the device-level contact 4 by patterning, wherein a portion of the second interlayer dielectric layer 20 is removed, and the second etch stop layer 19 is utilized to control the removal rate. The second etch stop layer 19 is penetrated to expose a top surface of the device-level contact 4.

Referring to FIG. 6F, FIG. 6F is a cross sectional view of an interconnect structure during intermediate stages of manufacturing operations, according to some embodiments of the present disclosure. A first densified dielectric layer 41 is formed over the exposed surface of the second interlayer dielectric layer 20. Specifically, the first densified dielectric layer 41 includes a sidewall portion 41$s$ on an inner sidewall of the first openings RB and a top portion 41$t$ over the second interlayer dielectric layer 20. In some embodiments, the first densified dielectric layer 41 is formed by performing oxidation operation on the exposed surfaces of the second interlayer dielectric layer 20. The oxidation operation may include irradiating a microwave on the second interlayer dielectric layer 20, wherein the operational temperature of the microwave is in a range from about 300° C. to about 400° C. Generally speaking, at the stage of BEOL fabrication operation, low processing temperature is desired. Therefore, in a comparative embodiment, performing an annealing operation over 400° C. to oxidize dielectric layers may deteriorate the performance of semiconductor device. Furthermore, microwave is a relatively mild operation that involve ionic radical interaction over the exposed surfaces of the second interlayer dielectric layer 20 (comparing to plasma bombardment). In another comparative embodiment, oxidizing the second interlayer dielectric layer 20 using plasma may impose physical bombardment over surfaces of dielectric layers, which may lead to reliability or current leakage issues. In some embodiments, during the oxidation operation, a native oxide layer 41OX may be formed at a portion of the top surface of the device-level contact 4. In addition, microwave oxidation can form the first dielectric layer 41 with a thickness of from about 0.2 nm to about 2 nm, in order to obtain the benefit previously discussed. It is easier to achieve such shallow oxidation by using microwave than plasma or other conventional approaches.

In some alternative embodiments, the second interlayer dielectric layer 20 includes silicon oxide (SiO$_x$), and a nitrification operation is performed to convert a surface of the second interlayer dielectric layer 20 into silicon oxynitrides (SiO$_x$N$_y$) to form the first densified dielectric layer 41.

Referring to FIG. 6G, FIG. 6G is a cross sectional view of an interconnect structure during intermediate stages of manufacturing operations, according to some embodiments of the present disclosure. Native oxide layer between two conductive layers in an interconnect structure may be one of the reasons that cause higher interface resistance and leads to greater overall resistance, therefore, it is desired to remove the aforesaid native oxide layer 41OX as much as possible. Furthermore, by increasing an area of a contact interface to be connected to another conductive layer (i.e. the conductive via 5 to be discussed subsequently), the resistance can further be decreased. Therefore, a top surface of the device-level contact 4 is recessed to form a recess RV concaved toward the substrate 1, and at least a portion of the native oxide layer 41OX is removed. In some embodiments, the entire native oxide layer 41OX is removed to achieve lower resistance.

In some embodiments, the recessing of the device-level contact 4 can be performed by applying pre-clean chemical or tungsten hexafluoride (WF$_6$). Specifically, WF$_6$ can be utilized to remove the native oxide layer 41OX and recess the device-level contact 4, and the first densified dielectric layer 41 can be utilized as a protection layer to alleviate etching on the sidewall of the second interlayer dielectric layer 20, thereby offers an extended window to form the concaved recess RV and removing the native oxide layer 41OX. In some embodiments, a width WRV of the concaved recess RV is greater than a dimension DRB of the first opening RB. For example, the dimension DRB is in a range from about 10 nm to about 15 nm, the width WRV is in a range from about 10 nm to about 20 nm. It should be understood that the illustration in FIG. 6G is simplified for comprehension, the concaved recess RV may possess various rounded boundaries and the width WRV can be identified as the widest dimension of the concaved recess RV.

Referring to FIG. 6H, FIG. 6H is a cross sectional view of an interconnect structure during intermediate stages of manufacturing operations, according to some embodiments of the present disclosure. A second conductive material 5M is filled into the first openings RB and the recesses RV (shown in FIG. 6G) and formed over the top portion 41$t$ of the first densified dielectric layer 41. In some embodiments, the second conductive material 5M is different from the first conductive material 4M (as discussed in FIG. 6B). In some embodiments, the second conductive material 5M has a conductivity greater than the conductivity of the first conductive material 4M. For example, the second conductive material 5M may include ruthenium (Ru), the first conductivity material 4M may include tungsten or cobalt.

Referring to FIG. 6I, FIG. 6I is a cross sectional view of an interconnect structure during intermediate stages of manufacturing operations, according to some embodiments of the present disclosure. A planarization operation, such as CMP, is performed to remove excessive portion of the second conductive material 5M. The conductive via 5 is thereby formed. The top surface of the conductive via 5 is coplanar with a top surface of the top portion 41$t$ of the first densified dielectric layer 41. It should be noted that, the conductive via 5 includes a bottom portion 5\* over and laterally surrounded by the device-level contact 4 (that is, the portion that was formed in the recess RV), and an upper portion 5' laterally surrounded by the sidewall portion 41s of the first densified dielectric layer 41. In some embodiments, the first densified dielectric layer 41 can serve as the planarization stop layer that can facilitate the end point control of the CMP operation, thus alleviate the issues related to CMP operations, such as the occurrence of penetration of the metal residue between the conductive via 5 and the second interlayer dielectric layer 20 due to poor control of CMP operation or lack of protection for the second interlayer dielectric layer 20.

Referring to FIG. 6J, FIG. 6J is a cross sectional view of an interconnect structure during intermediate stages of manufacturing operations, according to some embodiments of the present disclosure. A third etch stop layer 29 is formed over the second interlayer dielectric layer 20 and the conductive vias 5. A third interlayer dielectric layer 30 is formed over the third etch stop layer 29. The material of the third interlayer dielectric layer 30 and the third etch stop layer 29 can be referred back to FIG. 1A to FIG. 1B.

Referring to FIG. 6K, FIG. 6K is a cross sectional view of an interconnect structure during intermediate stages of manufacturing operations, according to some embodiments of the present disclosure. Second openings RC are formed in the third interlayer dielectric layer 30 over the conductive vias 5 by patterning, wherein a portion of the third interlayer dielectric layer 30 is removed, and the third etch stop layer 29 is utilized to control the removal rate. The third etch stop layer 29 is penetrated to expose a top surface of each of the conductive vias 5.

Referring to FIG. 6L, FIG. 6L is a cross sectional view of an interconnect structure during intermediate stages of manufacturing operations, according to some embodiments of the present disclosure. A second densified dielectric layer 42 is formed over the exposed surface of the third interlayer dielectric layer 30. Specifically, the second densified dielectric layer 42 includes a sidewall portion 42s on an inner sidewall of the second openings RC and a top portion 42t over the third interlayer dielectric layer 30. In some embodiments, the second densified dielectric layer 42 is formed by performing oxidation operation on the exposed surfaces of the third interlayer dielectric layer 30. Similar to previously discussed oxidation operation in FIG. 6F, the oxidation operation may include irradiating a microwave on the third interlayer dielectric layer 20, wherein the operational temperature of the microwave is lower than 400° C. (in some embodiments in a range from about 300° C. to about 400° C.). In some embodiments, during the oxidation operation, a native oxide layer 42OX may be formed at a portion of the top surface of the conductive vias 5'. In addition, microwave oxidation can form the second dielectric layer 42 with a thickness of from about 0.2 nm to about 2 nm, in order to obtain the benefit previously discussed. It is easier to achieve such shallow oxidation by using microwave than plasma or other conventional approaches.

In some alternative embodiments, the third interlayer dielectric layer 30 includes silicon oxide ($SiO_x$), and a nitrification operation is performed to convert a surface of the third interlayer dielectric layer 30 into silicon oxynitrides ($SiO_xN_y$) to form the second densified dielectric layer 42.

Referring to FIG. 6M, FIG. 6M is a cross sectional view of an interconnect structure during intermediate stages of manufacturing operations, according to some embodiments of the present disclosure. Native oxide layer between two conductive layers in an interconnect structure may be one of the reasons that cause higher interface resistance and leads to greater overall resistance, therefore, it is desired to remove the aforesaid native oxide layer 42OX. Therefore, a top portion of the conductive via 5 is removed to form a recess RX, and at least a portion of the native oxide layer 42OX is removed. In some embodiments, the entire native oxide layer 42OX is removed to achieve lower resistance. It should be understood that the illustration in FIG. 6M is simplified for comprehension, and the concaved recess RX may possess various rounded boundaries.

In some embodiments, the recessing of the top portion of the conductive vias 5 can be performed by applying pre-clean chemical or tungsten hexafluoride ($WF_6$). Specifically, $WF_6$ can be utilized to remove the native oxide layer 42OX and a portion of the conductive vias 5, and the second densified dielectric layer 42 can be utilized as a protection layer to alleviate etching on the sidewall of the third interlayer dielectric layer 30, thereby offers an extended window to remove the native oxide layer 42OX.

Referring to FIG. 6N, FIG. 6N is a cross sectional view of an interconnect structure during intermediate stages of manufacturing operations, according to some embodiments of the present disclosure. A third conductive material 6M is filled into the second openings RC and the recesses RX (shown in FIG. 6M) and formed over the top portion 42t of the second densified dielectric layer 42. In some embodiments, the third conductive material 6M can be different from the second conductive material 5M (as discussed in FIG. 6H), but the present disclosure is not limited thereto.

Referring to FIG. 6O, FIG. 6O is a cross sectional view of an interconnect structure during intermediate stages of manufacturing operations, according to some embodiments of the present disclosure. A planarization operation, such as CMP, is performed to remove excessive portion of the third conductive material 6M. The conductive line 6 is thereby formed. The top surface of the conductive line 6 is coplanar with a top surface of the top portion 42t of the second densified dielectric layer 42. It should be noted that, the conductive line 6 includes a bottom portion 6\* over and laterally surrounded by the conductive vias 5 (that is, the portion that was formed in the recess RX), and an upper portion 6' laterally surrounded by the sidewall portion 42s of the second densified dielectric layer 42. In some embodiments, the second densified dielectric layer 42 can serve as the planarization stop layer that can facilitate the end point control of the CMP operation and alleviate residue penetration issue.

Referring to FIG. 7A, FIG. 7A is a cross sectional view of an interconnect structure during intermediate stages of manufacturing operations, according to some embodiments of the present disclosure. Subsequent to the operations discussed in FIG. 4 to FIG. 5, the first interlayer dielectric layer 10 is patterned to form via holes RAA over the conductive regions EP. Herein the first etch stop layer 9 is utilized to alleviate the issue of over etching. Top surfaces of the conductive regions EP are exposed. Silicide layers 3 are formed over the exposed top surfaces of the conductive regions EP. A zeroth densified dielectric layer 40 is formed over the exposed surface of the first interlayer dielectric layer 10. Specifically, the zeroth densified dielectric layer 40 includes a sidewall portion 40s on an inner sidewall of the via holes RAA, and a top portion 40t over the first interlayer dielectric layer 10. The operations for forming the zeroth densified dielectric layer 40 can be referred to the discussion in FIG. 6A.

Figure 7B:
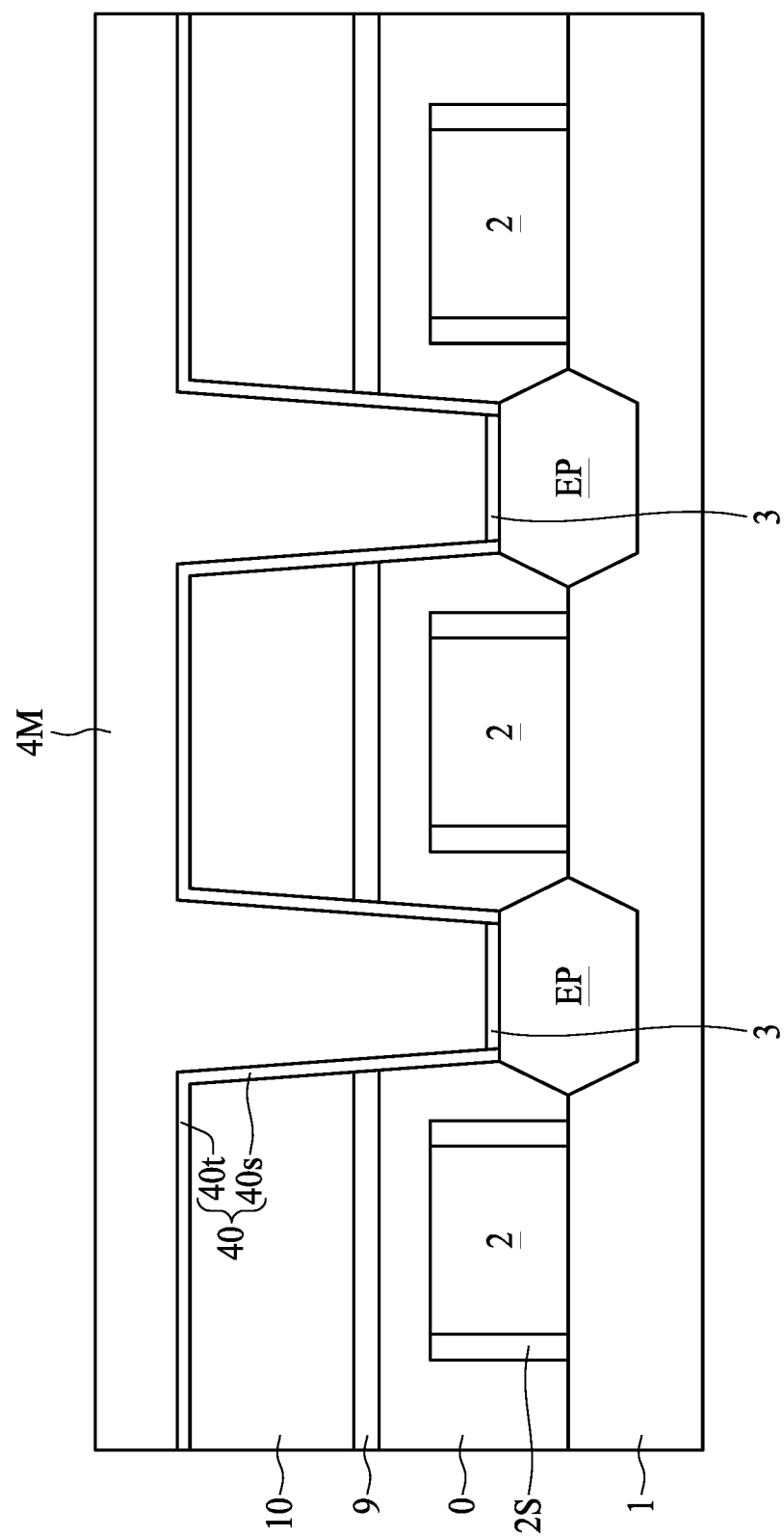
Figure 7C:
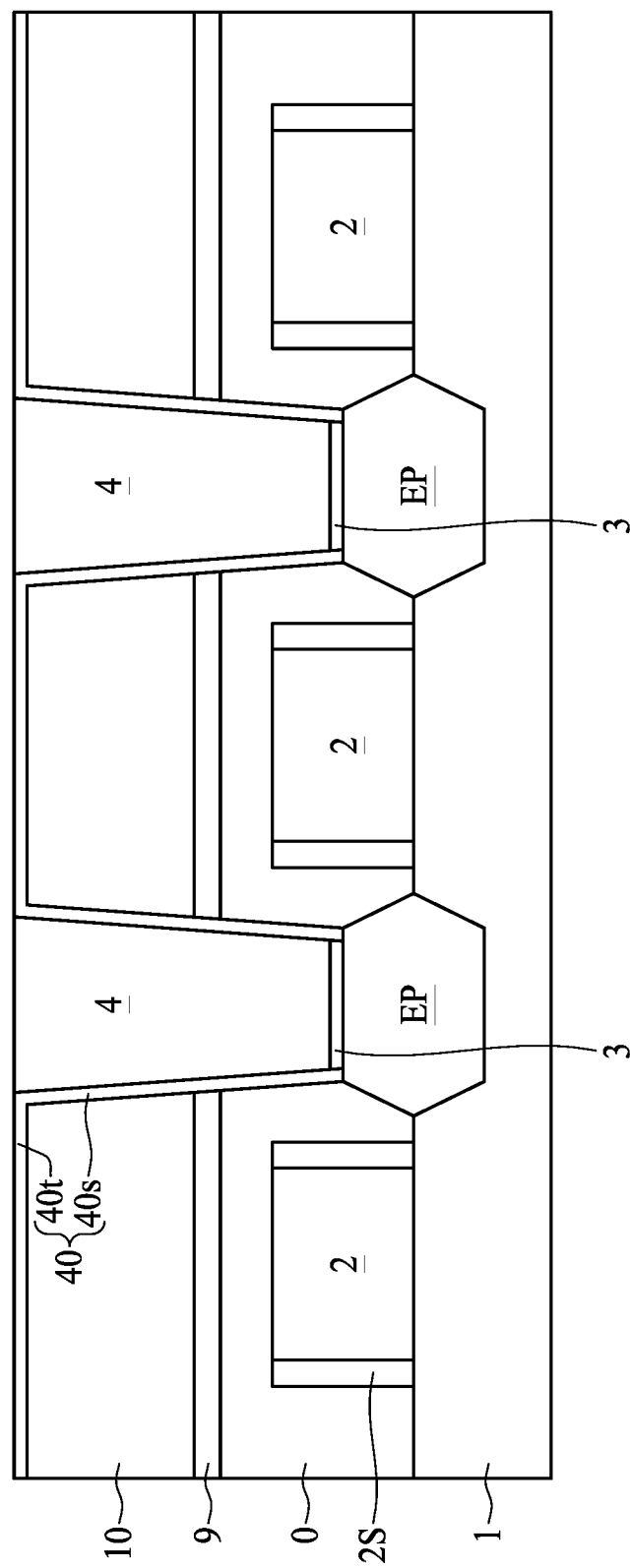

Referring to FIG. 7B, FIG. 7B is a cross sectional view of an interconnect structure during intermediate stages of manufacturing operations, according to some embodiments of the present disclosure. A first conductive material 4M is filled into the via holes RAA (shown in FIG. 7A), and further covers a top surface of the first interlayer dielectric layer 10. (The material of the first conductive material 4M can be referred to FIG. 6B or FIG. 1A to FIG. 2) Referring to FIG. 7C, FIG. 7C is a cross sectional view of an interconnect structure during intermediate stages of manufacturing operations, according to some embodiments of the present disclosure. A planarization operation, such as CMP, is performed to remove excessive portion of the first conductive material 4M. The device-level contacts 4 are thereby formed over the conductive regions EP. Each of the top surfaces of the device-level contact 4 are coplanar.

Figure 7D:
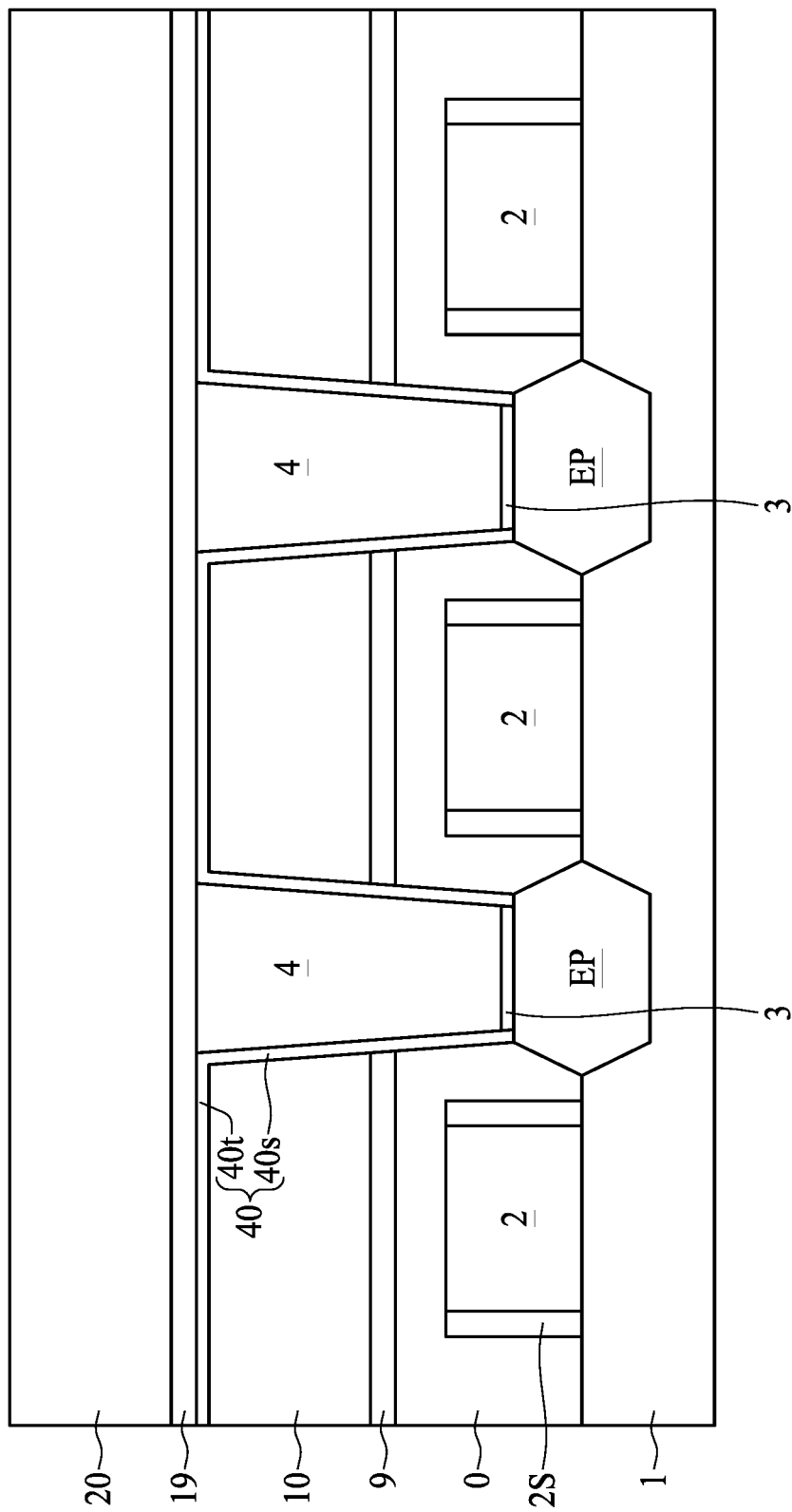

Referring to FIG. 7D, FIG. 7D is a cross sectional view of an interconnect structure during intermediate stages of manufacturing operations, according to some embodiments of the present disclosure. A second etch stop layer 19 is formed over the first interlayer dielectric layer 10, and the device-level contact 4. A second interlayer dielectric layer 20 is formed over the second etch stop layer 19. The material of the second interlayer dielectric layer 20 and the second etch stop layer 19 can be referred back to FIG. 1A to FIG. 1B.

Figure 7E:
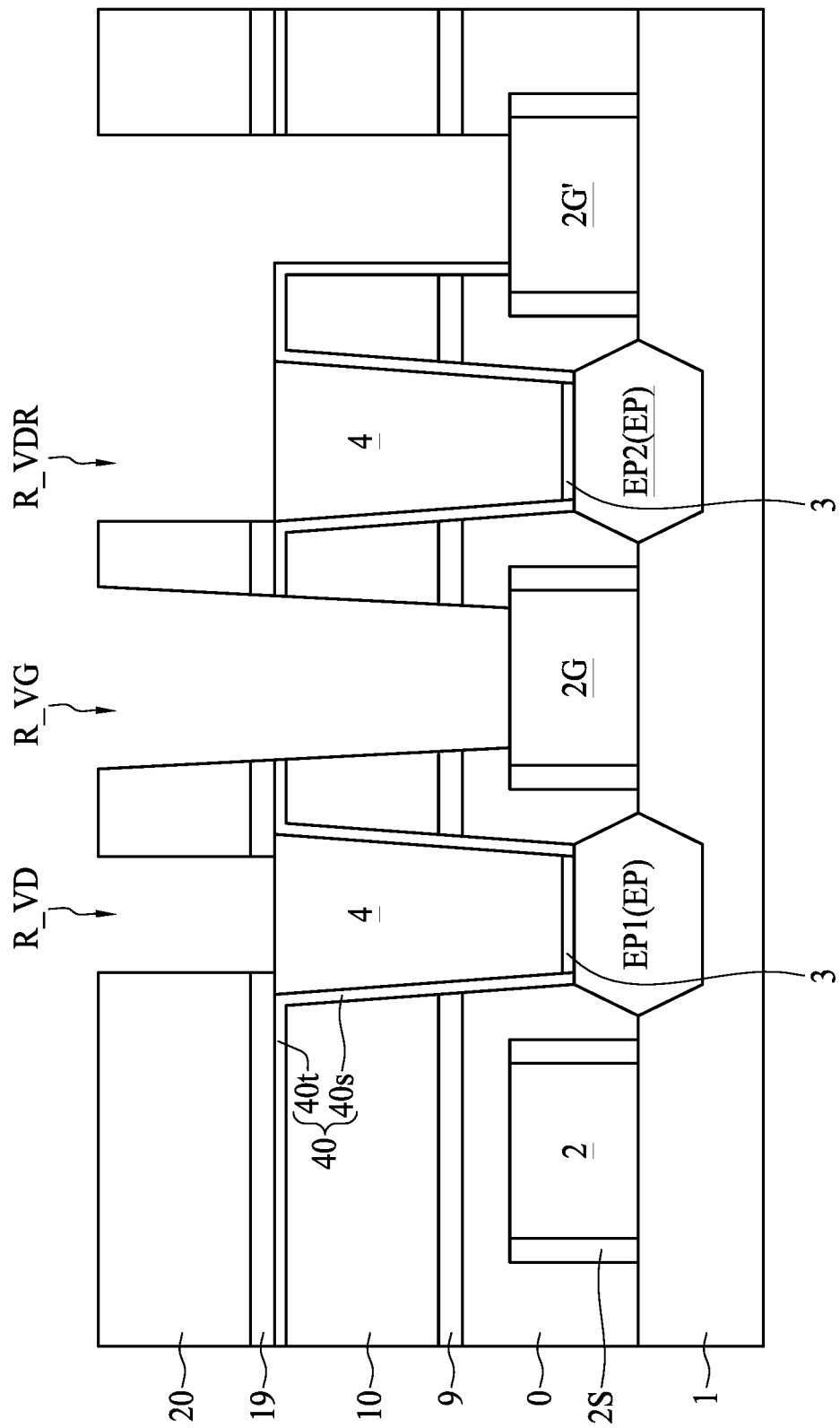

Referring to FIG. 7E, FIG. 7E is a cross sectional view of an interconnect structure during intermediate stages of manufacturing operations, according to some embodiments of the present disclosure. Openings R_VD, R_VG and R_VDR are formed in the second interlayer dielectric layer 20 over each of the device-level contact 4 by patterning, wherein the opening R_VD is formed over one of the conductive region (hereinafter denoted as a first conductive region EP1), the opening R_VG is formed over one of the gate structures 2 (hereinafter denoted as a gate structure 2G), the opening R_VDR is formed both over another conductive region EP (hereinafter denoted as a second conductive region EP2) and another gate structure 2 (hereinafter denoted as a gate structure 2G'). A portion of the second etch stop layer 19 is penetrated to expose a top surface of the device-level contact 4, and a portion of the first etch stop layer 9 is penetrated to expose top surfaces of the gate structures 2G and 2G'. Herein a portion of a top surface of the first interlayer dielectric layer 10 is exposed by the opening R_VDR.

In some embodiments, the openings R_VD, R_VG and R_VDR may be patterned in different timing or by using different masks. For example, the opening R_VG is formed, the opening R_VD is formed subsequently, and the opening R_VDR is formed after forming openings R_VG and R_VD. However, the present disclosure is not limited thereto.

Figure 7F:
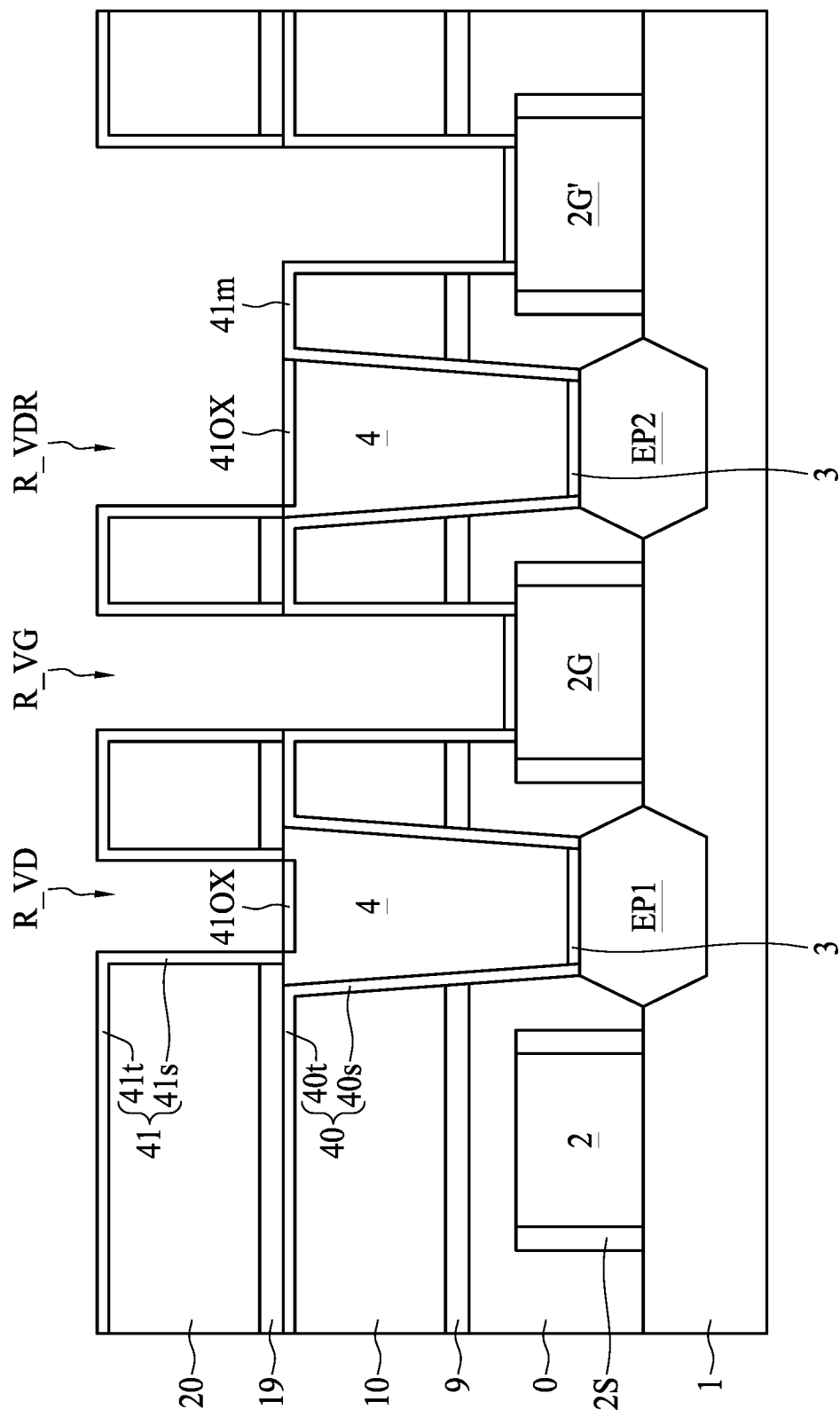

Referring to FIG. 7F, FIG. 7F is a cross sectional view of an interconnect structure during intermediate stages of manufacturing operations, according to some embodiments of the present disclosure. A first densified dielectric layer 41 is formed over the exposed surface of the second interlayer dielectric layer 20. Specifically, the first densified dielectric layer 41 includes a sidewall portion 41s on an inner sidewall of the openings R_VD, R_VG and R_VDR, a top portion 41t over the second interlayer dielectric layer 20, and a portion 41m over an exposed top surface of the first interlayer dielectric layer 10. The operations for forming the first densified dielectric layer 41 can be referred to the discussion in FIG. 6F. In some embodiments, during the oxidation operation, a native oxide layer 41OX may be formed at a portion of the top surface of the device-level contact 4. In some embodiments, the native oxide layer 41OX may be formed over the gate structures 2G and 2G'.

Figure 7G:
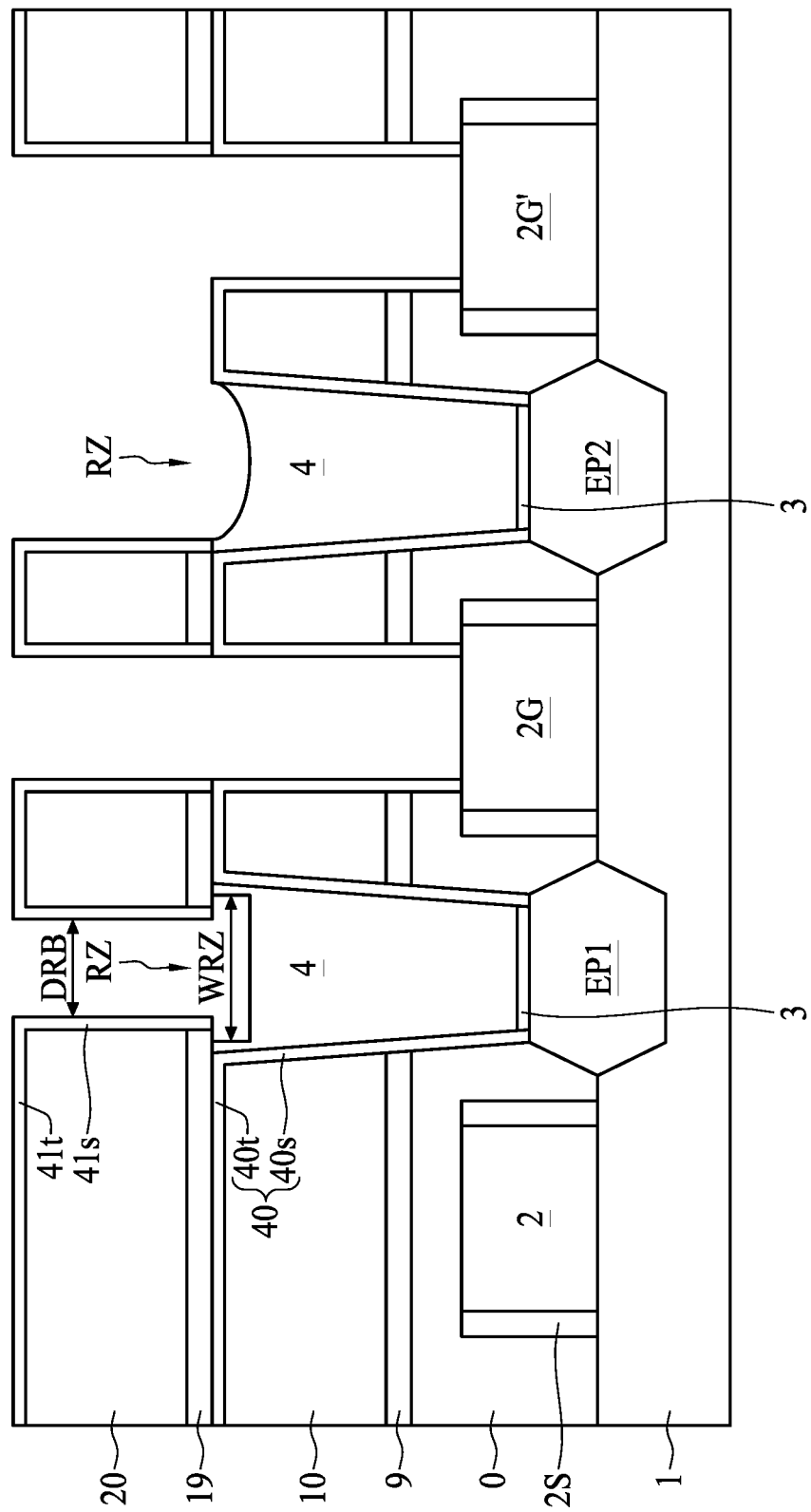

Referring to FIG. 7G, FIG. 7G is a cross sectional view of an interconnect structure during intermediate stages of manufacturing operations, according to some embodiments of the present disclosure. Exposed top surfaces of the device-level contact 4 are recessed to form recesses RZ concaved toward the substrate 1, and at least a portion of the native oxide layer 41OX is removed. In some embodiments, the entire native oxide layer 41OX is removed to achieve lower resistance. The native oxide layer 41OX over the gate structures 2G and 2G' may be partially or entirely removed. The operations for removing the native oxide layer 41OX can be referred to FIG. 6G. In some embodiments, the recessing of the device-level contact 4 can be performed by applying pre-clean chemical or tungsten hexafluoride ($WF_6$). Specifically, $WF_6$ can be utilized to remove the native oxide layer 41OX and recess the device-level contact 4, and the first densified dielectric layer 41 can be utilized as a protection layer to alleviate etching on the sidewall of the second interlayer dielectric layer 20, thereby offers an extended window to form the concaved recess RZ and removing the native oxide layer 41OX. In some embodiments, a width WRZ of the concaved recess RZ is greater than a dimension DRB of the first opening RB. For example, the dimension DRB is in a range from about 10 nm to about 15 nm, the width WRZ is in a range from about 10 nm to about 20 nm. It should be understood that the illustration in FIG. 7G is simplified for comprehension, and the concaved recess RZ may possess various rounded boundaries and the width WRZ can be identified as the widest dimension of the concaved recess RZ. In some of the embodiments, exposed top surfaces of the gate structures 2G and 2G' may be recessed during the removal of the native oxide layer 41OX.

Figure 7H:
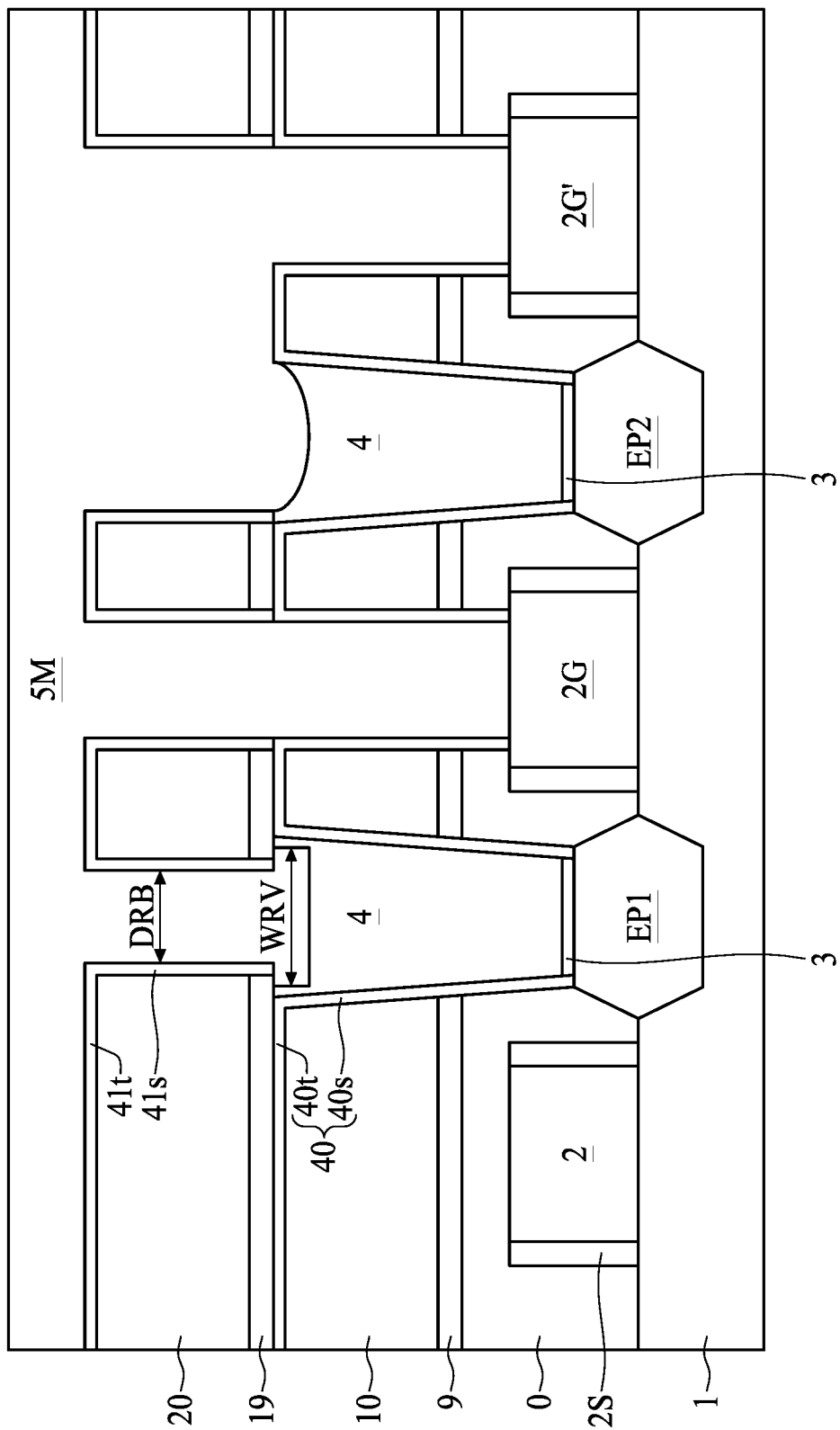

Referring to FIG. 7H, FIG. 7H is a cross sectional view of an interconnect structure during intermediate stages of manufacturing operations, according to some embodiments of the present disclosure. A second conductive material 5M is filled into the openings R_VD, R_VG and R_VDR (shown in FIG. 6G), in the recesses RZ and formed over the top portion 41t of the first densified dielectric layer 41. The material of the second conductive material 5M can be referred to the discussion in FIG. 6H.

Figure 7I:
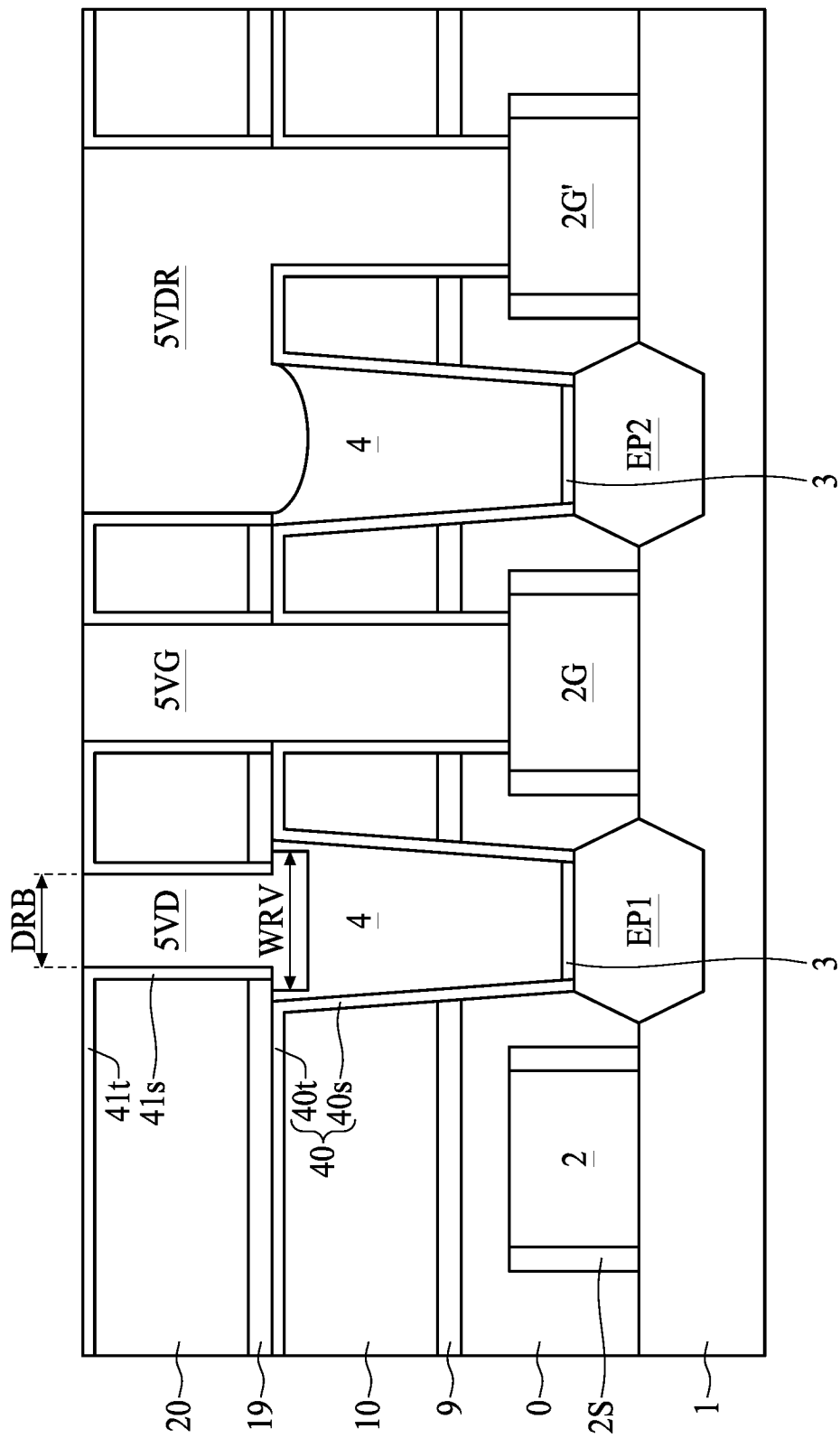

Referring to FIG. 7I, FIG. 7I is a cross sectional view of an interconnect structure during intermediate stages of manufacturing operations, according to some embodiments of the present disclosure. Similar to FIG. 6I, a planarization operation, such as CMP, is performed to remove excessive portion of the second conductive material 5M. The first conductive via 5VD, the second conductive via 5VG, and the third conductive via 5VDR are thereby formed. The top surfaces of the first conductive via 5VD, the second conductive via 5VG, and the third conductive via 5VDR are coplanar with a top surface of the top portion 41t of the first densified dielectric layer 41.

Figure 7J:
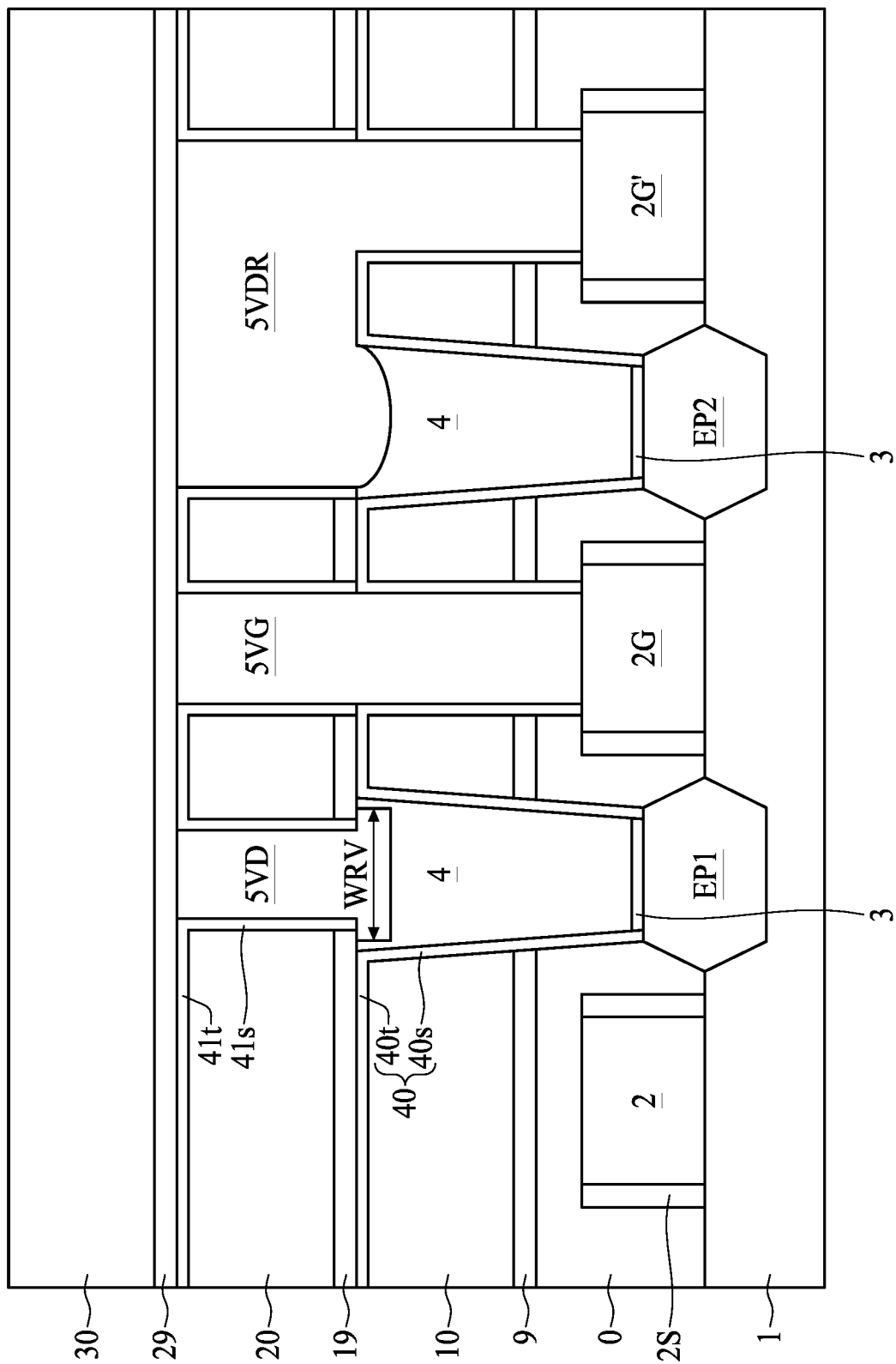

Referring to FIG. 7J, FIG. 7J is a cross sectional view of an interconnect structure during intermediate stages of manufacturing operations, according to some embodiments of the present disclosure. A third etch stop layer 29 is formed over the second interlayer dielectric layer 20 and the first conductive via 5VD, the second conductive via 5VG, and the third conductive via 5VDR. A third interlayer dielectric layer 30 is formed over the third etch stop layer 29. The material of the third interlayer dielectric layer 30 and the third etch stop layer 29 can be referred back to FIG. 1A to FIG. 1B or FIG. 6J.

Figure 7K:
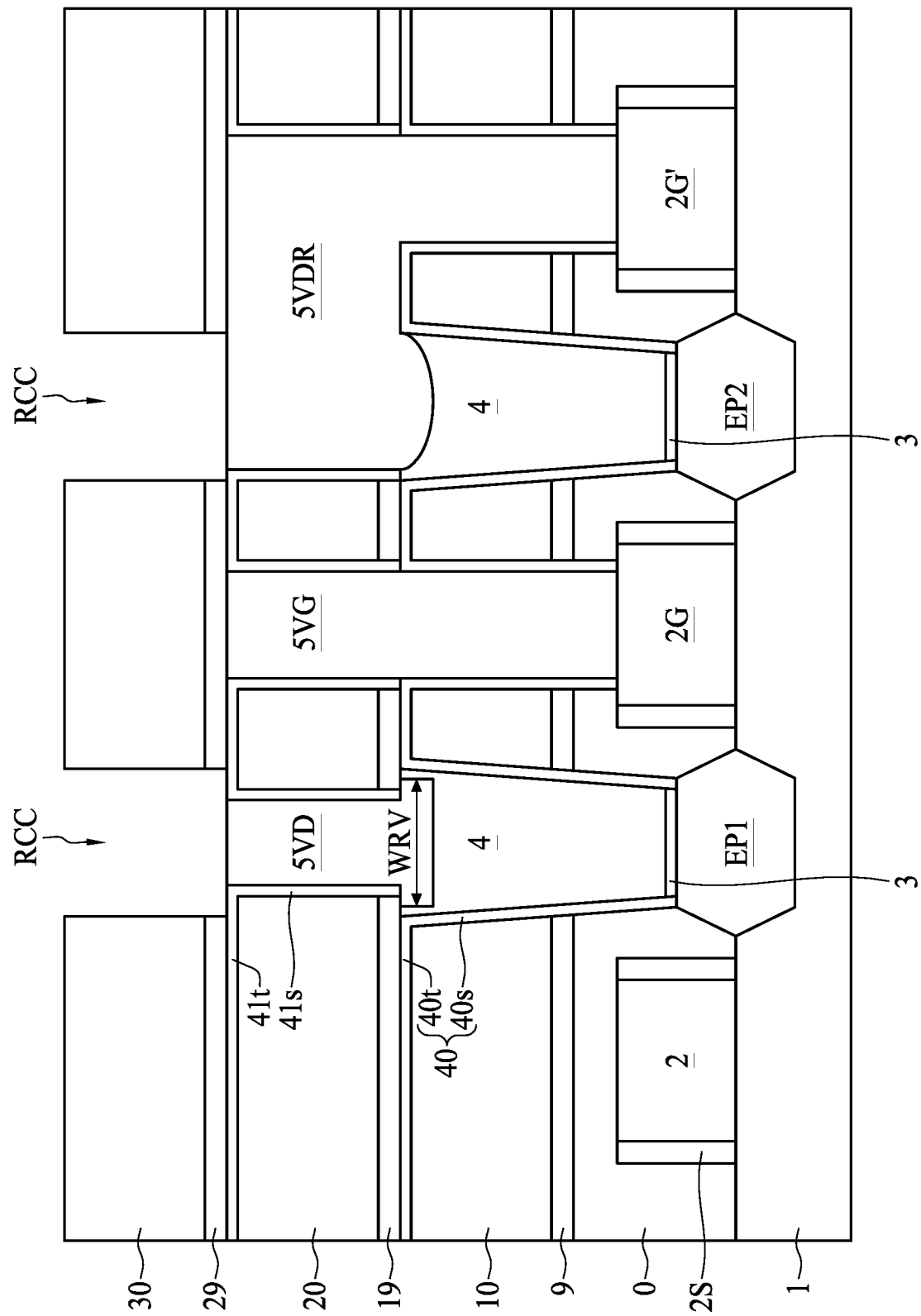

Referring to FIG. 7K, FIG. 7K is a cross sectional view of an interconnect structure during intermediate stages of manufacturing operations, according to some embodiments of the present disclosure. Openings RCC are formed in the third interlayer dielectric layer 30 over the first conductive via 5VD and the third conductive via 5VDR by patterning, wherein a portion of the third interlayer dielectric layer 30 is removed, and the third etch stop layer 29 is utilized to control the removal rate. The third etch stop layer 29 is penetrated to expose a top surface of each of the first conductive via 5VD and the third conductive via 5VDR. In some of alternative embodiments, an opening over the second conductive via 5VG may also be formed.

Figure 7L:
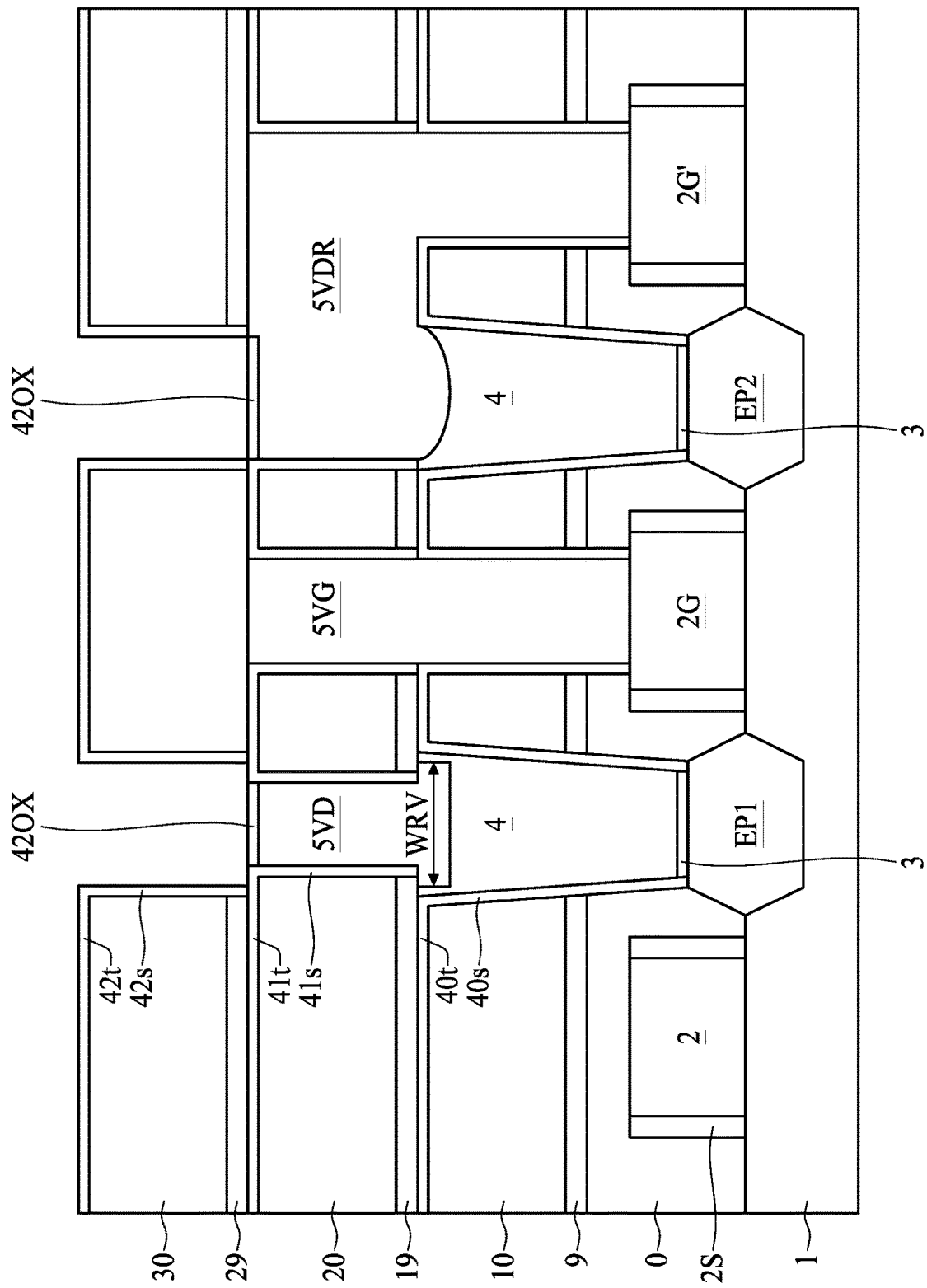

Referring to FIG. 7L, FIG. 7L is a cross sectional view of an interconnect structure during intermediate stages of manufacturing operations, according to some embodiments of the present disclosure. A second densified dielectric layer 42 is formed over the exposed surface of the third interlayer dielectric layer 30. Specifically, the second densified dielectric layer 42 includes a sidewall portion 42s on an inner sidewall of the second openings RCC and a top portion 42t over the third interlayer dielectric layer 30. The operations for forming the second densified dielectric layer 42 can be referred to the discussion in FIG. 6L. In some embodiments, during the oxidation operation, a native oxide layer 42OX may be formed at a portion of the top surface of the first conductive via 5VD and the third conductive via 5VDR.

Figure 7M:
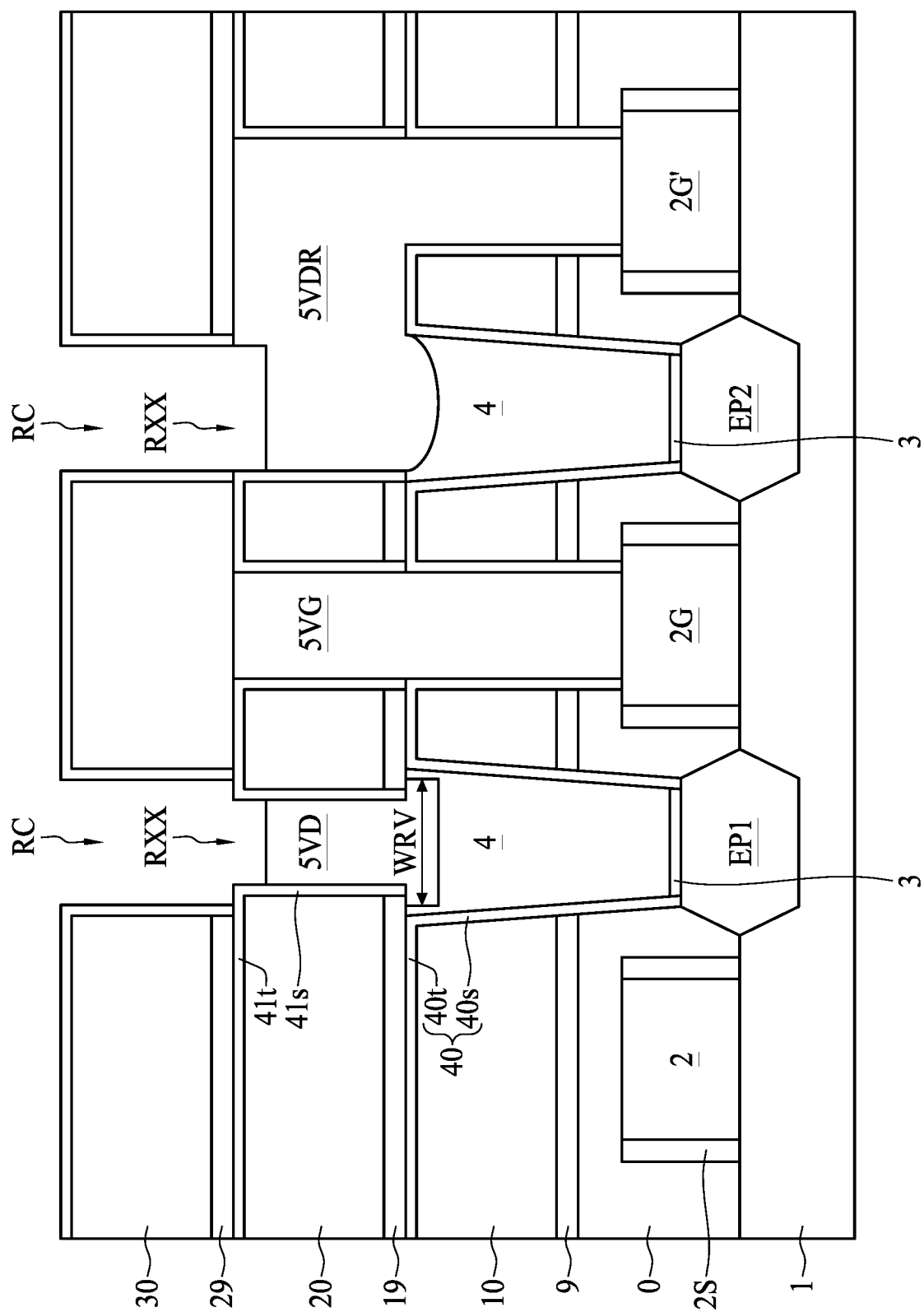

Referring to FIG. 7M, FIG. 7M is a cross sectional view of an interconnect structure during intermediate stages of manufacturing operations, according to some embodiments of the present disclosure. Similar to the discussion in FIG. 6M, a top portion of the first conductive via 5VD and the third conductive via 5VDR is removed to form a recess RXX, and at least a portion of the native oxide layer 42OX is removed. In some embodiments, the entire native oxide layer 42OX is removed to achieve lower resistance. The details of native oxide layer removal operation can be referred to FIG. 6M. It should be understood that the illustration in FIG. 7M is simplified for comprehension, and the recess RXX may possess various rounded boundaries.

Figure 7N:
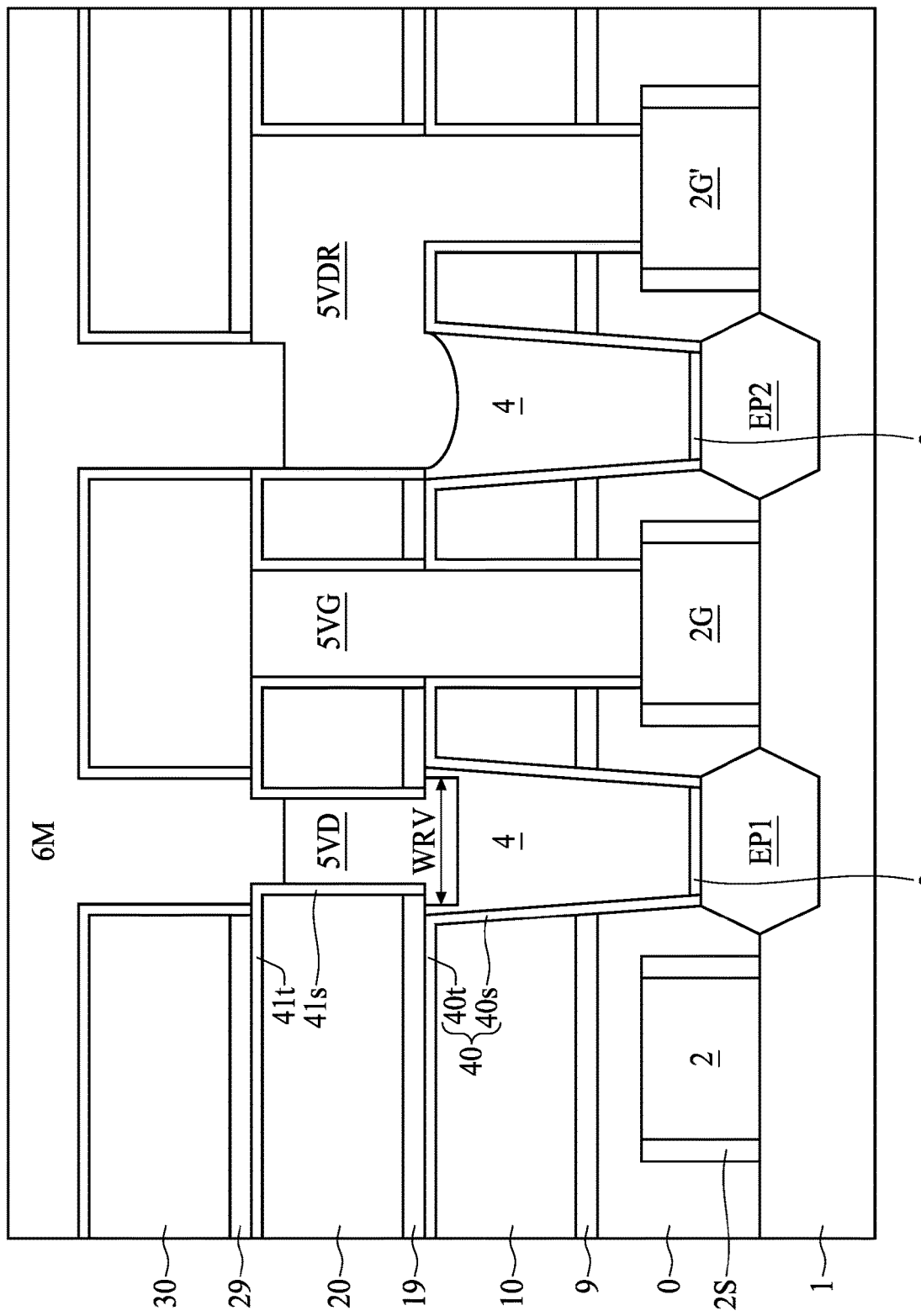
Figure 7O:
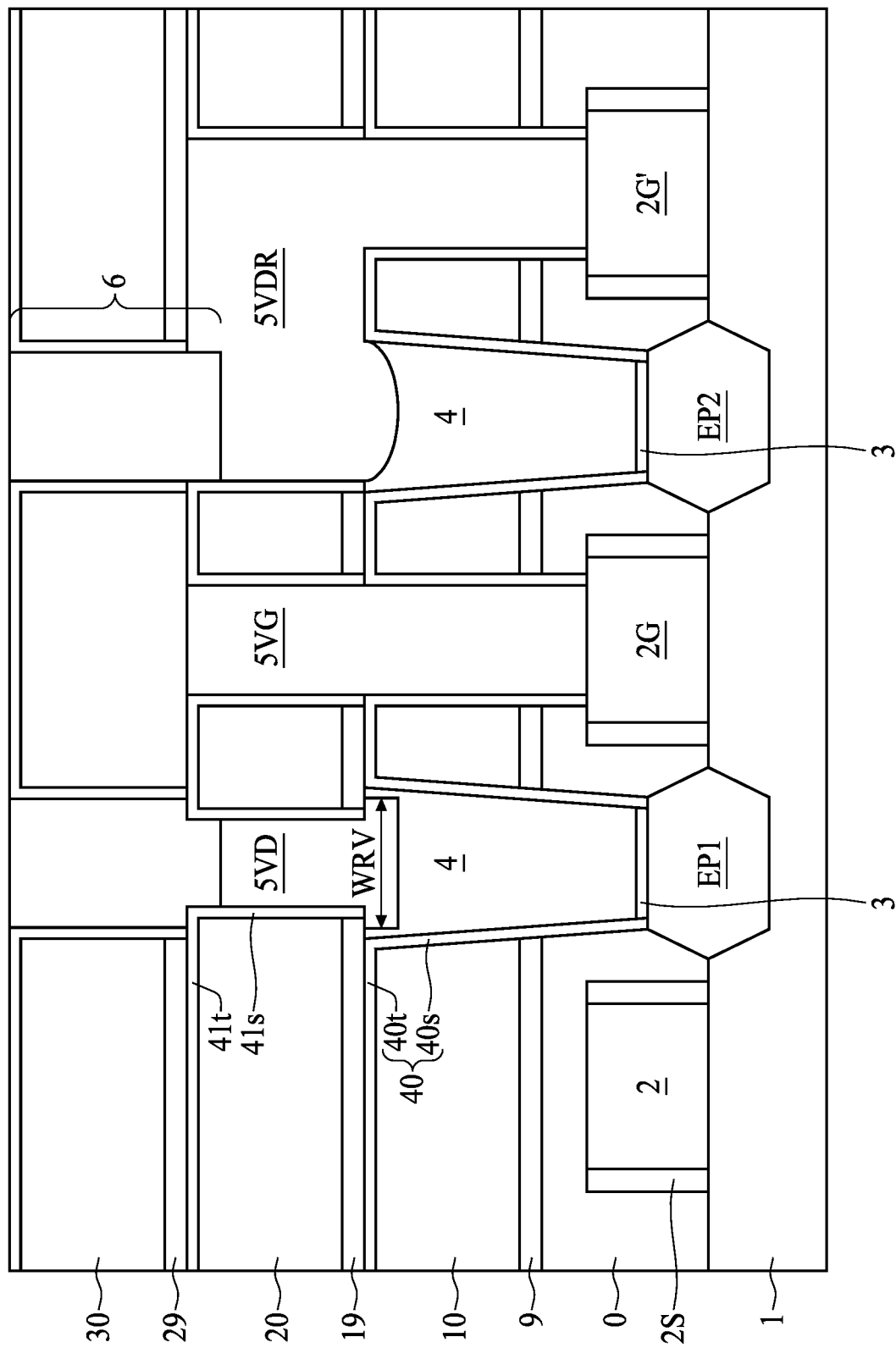

Referring to FIG. 7N, FIG. 7N is a cross sectional view of an interconnect structure during intermediate stages of manufacturing operations, according to some embodiments of the present disclosure. Similar to the discussion in FIG. 6N, a third conductive material 6M is filled into the second openings RCC and the recesses RXX (shown in FIG. 7M) and formed over the top portion 42t of the second densified dielectric layer 42.

Referring to FIG. 7O, FIG. 7O is a cross sectional view of an interconnect structure during intermediate stages of manufacturing operations, according to some embodiments of the present disclosure. A planarization operation, such as CMP, is performed to remove excessive portion of the third conductive material 6M. The conductive line 6 is thereby formed. The top surface of the conductive line 6 is coplanar with a top surface of the top portion 42t of the second densified dielectric layer 42. In some embodiments, the second densified dielectric layer 42 can serve as the planarization stop layer that can facilitate the end point control of the CMP operation and alleviate residue penetration issue.

The present disclosure provides interconnect structures utilizing densified dielectric to alleviate current leakage issue. Generally speaking, it is desirable to control thermal budget to be lower than 400° C. during BEOL operations. Therefore, prior to forming conductive vias 5 (discussed in FIG. 1A, FIG. 1B and FIG. 6A to FIG. 6O), the first conductive via 5VD, the second conductive via 5VG, and the third conductive via 5VDR (discussed in FIG. 2 and FIG. 7A to FIG. 7O) and conductive lines 6, a densification operation can be performed to densify the exposed surface of interlayer dielectric layers 20, 30, or 10. The densification operation may include utilizing microwave to oxidize interlayer dielectric layer materials, wherein the microwave oxidation can be performed under 400° C. and with comparatively less physical bombardment comparing to plasma oxidation operations. Alternatively, the densification operation may be carried out by a nitrification operation using microwave. The formed densified dielectric layers 40, 41 and 42 can be utilized to alleviate current leakage between adjacent conductive lines and serve as a CMP stop layer to facilitate CMP ending control, thereby may be able to remove residues effectively and alleviating residue penetration issues.

Since a native oxide layer may be formed at a top surface of the device-level contact 4 and the conductive vias 5 (or 5VD, 5VG, 5VDR) during the microwave oxidation operation, a pre-cleaning operation or $WF_6$ cleaning can be performed to remove the native oxide layers. Such native oxide removal operation further recesses the top surfaces of the device-level contact 4, the conductive vias 5 (or 5VD, 5VG, 5VDR), and or gate structure 2 (or 2G, 2G'), therefore increasing the area of contact interface between two different conductive materials. By this configuration, the interface resistance can be reduced. In addition, the aforementioned densified dielectric layers 41 and 42 may serve as an etch protection layer during the pre-cleaning operation or $WF_6$ cleaning to alleviate the etching on the sidewalls of interlayer dielectric layers.

Furthermore, the aforementioned operations and configurations are suitable to devices that uses ruthenium (Ru) as a material of conductive vias 5 (or 5VD, 5VG, 5VDR), wherein ruthenium offers lower bulk resistance, and compatible to BEOL process requirements.

Some embodiments of the present disclosure provide an interconnect structure, including a substrate having a conductive region adjacent to a gate region, a contact over the conductive region, a first interlayer dielectric layer(ILD) surrounding the contact, a via over the contact, a first densified dielectric layer surrounding the via, wherein the densified dielectric layer has a first density, and a second ILD layer over the first ILD layer and surrounding the via, wherein the second ILD layer has a second density, the first density is greater than a second density.

Some embodiments of the present disclosure provide an interconnect structure, including a substrate having a conductive region adjacent to a gate region, a contact over the conductive region, a first interlayer dielectric (ILD) layer surrounding the contact, a via over the contact, wherein a contact interface between the contact and the via is lower than a top surface of the first ILD layer, and a second ILD layer over the first ILD layer and surrounding the via.

Some embodiments of the present disclosure provide a method for forming an interconnect structure, including providing a substrate, forming a first interlayer dielectric (ILD) layer over the substrate, forming a contact in the first ILD layer, wherein the contact comprises a first conductive material, forming a second ILD layer over the first ILD layer, patterning a first opening in the second ILD layer and obtaining an exposed side surface of the second ILD layer over the contact, forming a densified dielectric layer at the exposed side surface of the second ILD layer, and forming a via in contact with the densified dielectric layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an interconnect structure, comprising:
    forming a first interlayer dielectric (ILD) layer over a substrate;
    forming a contact in the first ILD layer;
    forming a second ILD layer over the first ILD layer;
    forming a first opening in the second ILD layer and obtaining an exposed side surface of the second ILD layer over the contact;
    forming a densified dielectric layer at the exposed side surface of the second ILD layer, comprising:
        oxidizing the exposed side surface of the second ILD layer by irradiating a microwave on the second ILD layer; and
    forming a via in contact with the densified dielectric layer.

2. The method of claim 1, further comprising recessing a top surface of the contact after forming the densified dielectric layer.

3. The method of claim 1, wherein a conductivity of the via is greater than a conductivity of the contact.

4. The method of claim 1, further comprising:
    forming a third ILD layer over the second ILD layer;
    forming a second opening in the third ILD layer correspond to the via;
    recessing a top surface of the via; and
    forming a conductive line over the top surface of the via and in the second opening.

5. The method of claim 1, wherein the contact is made of tungsten and the via is made of ruthenium.

6. The method of claim 1, wherein a composition of oxygen in the densified dielectric layer is greater than a composition of oxygen in the second ILD layer.

7. The method of claim 1, wherein an oxide layer is formed over the contact after oxidizing the exposed side surface of the second ILD layer.

8. The method of claim 7, further comprising removing the oxide layer by applying tungsten hexafluoride.

9. The method of claim 1, wherein an operational temperature of the microwave is lower than 400° C.

10. The method of claim 1, wherein a lower portion of the via is at a level below an entire of the densified dielectric layer, and the lower portion of the via is laterally surrounded by the contact.

11. A method for forming an interconnect structure, comprising:
    forming a first interlayer dielectric (ILD) layer over a substrate;
    forming a contact in the first ILD layer;
    forming a second ILD layer over the first ILD layer;
    forming a first opening in the second ILD layer and obtaining an exposed side surface of the second ILD layer over the contact; and
    irradiating a microwave on the second ILD layer, thereby forming a densified dielectric layer at the exposed side surface of the second ILD layer and an oxide layer over the contact.

12. The method of claim 11, further comprising forming the densified dielectric layer over a top surface of the second ILD layer.

13. The method of claim 12, wherein the oxide layer over the contact, and the densified dielectric layer over the exposed side surface and the top surface of the second ILD layer, are formed simultaneously.

14. The method of claim 11, further comprising removing the oxide layer by applying tungsten hexafluoride.

15. The method of claim 11, further comprising forming a via over the contact, wherein a lower portion of the via is laterally surrounded by the contact.

16. A method for forming an interconnect structure, comprising:
    forming a first interlayer dielectric (ILD) layer over a substrate;
    forming a contact recess in the first ILD layer;
    forming a densified dielectric layer at a sidewall of the contact recess, comprising:
        irradiating a microwave on the first ILD layer;
    forming a contact in the first ILD layer; and
    forming a second ILD layer over the first ILD layer.

17. The method of claim 16, wherein the contact is in direct contact with the densified dielectric layer.

18. The method of claim 16, further comprising forming the densified dielectric layer over a top surface of the first ILD.

19. The method of claim 16, further comprising recessing a top surface of the contact.

20. The method of claim 16, further comprising forming a via over the contact, wherein a lower portion of the via is laterally surrounded by the contact.

* * * * *